United States Patent
Berger

(10) Patent No.: US 9,437,752 B2
(45) Date of Patent: Sep. 6, 2016

(54) COMPACT MEMORY STRUCTURE INCLUDING TUNNELING DIODE

(71) Applicant: QuTel, Inc., Columbus, OH (US)

(72) Inventor: Paul Berger, Columbus, OH (US)

(73) Assignee: QuTel, Inc., Columbus, OH (US)

( * ) Notice: Subject to any disclaimer, the term of this patent is extended or adjusted under 35 U.S.C. 154(b) by 0 days.

(21) Appl. No.: 14/656,131

(22) Filed: Mar. 12, 2015

(65) Prior Publication Data

US 2015/0263181 A1   Sep. 17, 2015

Related U.S. Application Data

(60) Provisional application No. 61/951,959, filed on Mar. 12, 2014, provisional application No. 61/975,469, filed on Apr. 4, 2014, provisional application No. 61/984,492, filed on Apr. 25, 2014, provisional application No. 62/048,526, filed on Sep. 10, 2014.

(51) Int. Cl.
*H01L 29/66* (2006.01)
*H01L 29/88* (2006.01)
*H01L 27/105* (2006.01)
(Continued)

(52) U.S. Cl.
CPC ......... *H01L 29/882* (2013.01); *H01L 27/1052* (2013.01); *H01L 27/10805* (2013.01); *H01L 29/0688* (2013.01); *H01L 29/165* (2013.01);
(Continued)

(58) Field of Classification Search
CPC ........... H01L 27/1052; H01L 29/0688; H01L 29/0895; H01L 29/882
USPC ........ 257/104, 24, 19, 25, 213, 296; 365/72, 365/175, 154, 159
See application file for complete search history.

(56) References Cited

U.S. PATENT DOCUMENTS 5,267,193 A   11/1993   Lin
5,563,087 A   10/1996   Shen et al.
(Continued)

FOREIGN PATENT DOCUMENTS

WO   WO-2011034814 A1   3/2011
WO   WO-2015138731 A1   9/2015

OTHER PUBLICATIONS 90 nm 32×32 bit Tunneling SRAM Memory Array with 0.5 ns write access time, 1ns read access time and 0.5 V Operation. IEEE Transactions on Circuits and Systems-I: Regular papers, vol. 58, No. 10, Oct. 2011.*

(Continued)

*Primary Examiner* — Mohammed Shamsuzzaman
(74) *Attorney, Agent, or Firm* — Schwegman Lundberg & Woessner, P.A.

(57) ABSTRACT

A resonant inter-band tunnel diode (RITD) can be fabricated using semiconductor processing similar to that used for Complementary Metal-Oxide-Semiconductor (CMOS) device fabrication, such as can include using silicon. A memory cell (e.g., a random access memory (RAM) cell) can be fabricated to include one or more negative differential resistance device, such as tunneling diodes, such as to provide a single-bit or multi-bit cell. In an example, a "hybrid" memory cell can be fabricated, such as including one or more negative resistance devices, a MOS transistor structure, and a capacitor structure, such as including an integrated capacitor configuration similar to a generally-available dynamic RAM (DRAM) structure, but such as without requiring a refresh and offering a higher area efficiency.

2 Claims, 21 Drawing Sheets

(51) Int. Cl.
H01L 29/06 (2006.01)
H01L 27/108 (2006.01)
H01L 29/36 (2006.01)
H01L 29/165 (2006.01)

(52) U.S. Cl.
CPC ....... *H01L 29/365* (2013.01); *H01L 29/66121* (2013.01); *H01L 29/66151* (2013.01)

(56) References Cited

U.S. PATENT DOCUMENTS

| | | | |
|---|---|---|---|
| 5,646,884 A * | 7/1997 | van der Wagt | B82Y 10/00 365/168 |
| 5,684,737 A * | 11/1997 | Wang | G11C 11/36 257/15 |
| 5,953,249 A * | 9/1999 | van der Wagt | B82Y 10/00 257/24 |
| 6,285,582 B1 * | 9/2001 | Lin | B82Y 10/00 365/168 |
| 6,480,413 B2 * | 11/2002 | Lin | B82Y 10/00 365/105 |
| 6,803,598 B1 | 10/2004 | Berger et al. | |
| 7,015,497 B1 | 3/2006 | Berger | |
| 7,297,990 B1 | 11/2007 | Berger et al. | |
| 7,303,969 B2 | 12/2007 | Berger et al. | |
| 7,361,943 B2 | 4/2008 | Berger et al. | |
| 7,548,455 B2 | 6/2009 | Vega et al. | |
| 7,745,820 B2 | 6/2010 | Berger et al. | |
| 7,902,569 B2 | 3/2011 | Jin et al. | |
| 2003/0026126 A1 * | 2/2003 | Uemura | G11C 11/36 365/159 |
| 2003/0049894 A1 | 3/2003 | Berger et al. | |
| 2004/0238855 A1 | 12/2004 | King | |
| 2006/0284165 A1 | 12/2006 | Berger et al. | |
| 2008/0073641 A1 | 3/2008 | Cheng et al. | |
| 2009/0020748 A1 | 1/2009 | Jin et al. | |
| 2010/0085792 A1 * | 4/2010 | Matsuzaki | G11C 11/4023 365/72 |
| 2010/0200892 A1 * | 8/2010 | Hsu | H01L 29/885 257/104 |
| 2012/0199814 A1 | 8/2012 | Berger | |

OTHER PUBLICATIONS

"7.2.2 Stacked Capacitor Dram Cell", [Online]. Retrieved from the Internet: <URL: http://www.iue.tuwien.ac.at/phd/martins/node63.html, (Feb. 24, 1999), pp. 1-4.

"Intel details 22nm trigate SoC process at IEDM", Solid State Technology—Insights for Electronic Manufacturing, [Online]. Retrieved from the Internet: <URL: http://electroiq.com/chipworks_real_chips_blog/2012/12/11/intel-details.., (Dec. 11, 2012), pp. 1-3.

"Intel's 22-nm Trigate Transistors Exposed", Solid State Technology—Insights for Electronic Manufacturing, [Online]. Retrieved from the Internet: <URL: http://electroiq.com/chipworks_real_chips_blog/2012/04/24/intels-22-nm . . . , (Apr. 24, 2012), pp. 1-9.

Berger, Paul R, "Extending CMOS: Quantum Functional Circuits Using Si-Based Resonant Interband Tunnel Diodes", [Online]. Retrieved from the Internet: <URL: http://www2.ece.ohio-state.edu/~berger/summ_ritd/summ_ritd05.pdf>, (Mar. 11, 2005), 34 pgs.

Chung, Sung-Yong, et al., "Annealing of defect density and excess currents in Si-based tunnel diodes grown by low-temperature molecular-beam epitaxy", Journal of Applied Physics, 96, (Jul. 1, 2004), pp. 747-753.

Chung, Sung-Yong, et al., "Growth Temperature and Dopant Species Effects on Deep-Levels in Si Grown by Low Temperature Molecular Beam Epitaxy", Journal of Applied Physics , 93, (Jun. 1, 2003), pp. 9104-9110.

Chung, Sung-Yong, et al., "Monolithic vertical integration of Si/SiGe HBT and Si-Based resonant interband tunneling diode demonstrating latching operation and adjustable peak-to-valley current ratios", Rochester Institute of Technology RIT Scholar Works, [Online]. Retrieved from the Internet: <URL: http://scholarworks.rit.edu/other, (2003), pp. 296-299.

Hobart, K. D, et al., ""p-on-n" Si interband tunnel diode grown by molecular beam epitaxy", J. Vac. Sci. Technol. B,19, (2001), 290-293.

Jin, N., et al., "151 kA/cm2 Peak Current Densities in Si/SiGe Resonant Interband Tunneling Diodes for High-Power Mixed-Signal Applications", Applied Physics Letters, 83,, (Oct. 20, 2003), pp. 3308-3310.

Jin, N., et al., "Diffusion barrier cladding in Si/SiGe resonant interband tunneling diodes and their patterned growth on PMOS source/drain regions", IEEE Transactions on Electron Devices, 50(9), (Sep. 2003), pp. 1876-1884.

Jin, N., et al., "High Sensitivity Si-Based Backward Diodes for Zero-Biased Square-Law Detection and the Effect of Post-Growth Annealing on Performance", IEEE Electron Device Letters, vol. 26, No. 8, (Aug. 2005), pp. 575-578.

Jin, N., et al., "Improved vertically stacked Si/SiGe resonant interband tunnel diode pair with small peak voltage shift and unequal peak currents", Electronics Letters, 40(24), (Nov. 25, 2004), pp. 1548-1549.

Jin, N., et al., "pnp Si resonant interband tunnel diode with symmetrical NDR", Electronics Letters, 37(23), (2001), pp. 1412-1414.

Jin, N., et al., "The Effect of Spacer Thicknesses on Si-Based Resonant Interband Tunneling Diode Performance and Their Application to Low-Power Tunneling Diode SRAM Circuits", IEEE Transactions on Electron Devices, 53(9), (Sep. 2006), 2243-2249.

Jin, N., et al., "Tri-state logic using vertically integrated Si-SiGe resonant interband tunneling diodes with double NDR", IEEE Electron Device Letters, 25(9), (Sep. 2004), pp. 646-648.

Johnson, R. Colin, "Hybrid tunnel diodes could leapfrog Moore's Law", [Online]. Retrieved from the Internet: <URL: http://www.eetimes.com/document.asp?doc_id=1147132>, (Oct. 29, 2003), 3 pgs.

Park, Si-Young, et al., "Delta-Doped Si/SiGe Zero-Bias Backward Diodes for Micro-Wave Detection", IEEE Xplore, (2007), pp. 153-154.

Park, Si-Young, et al., "Zero-Bias Si Backword Diodes Detectors Incorporating P and B o-Doping Layers Grown by Chemical Vapor Deposition", ISDRS, Student Paper, (Dec. 2009), 2 pgs.

Park, S-Y, et al., "Sensitivity of Si-based zero-bias backward diodes for microwave detection", Electronics Letters, vol. 43, No. 5, (Mar. 1, 2007), 2 pgs.

Ramesh, A., et al., "High 5.2 peak-to-valley current ratio in Si/SiGe resonant interband tunnel diodes grown by chemical vapor deposition", Applied Physics Letters, 100, (Mar. 1, 2012), 092104.

Rommel, Sean L, et al., "Development of Delta-B/i-Si/Delta-Sb and Delta-B/i-Si/Delta-Sb/i-Si/Delta-B Resonant Interband Tunnel Diodes for Integrated Circuit Applications", 58th Annual Device Research Conference in Denver, CO, (Jun. 19-21, 2000), 2 pgs.

Sunami, Hideo, "Chapter 15: Dimension Increase in Metal-Oxide-Semiconductor Memories and Transistors", Advances in Solid State Circuit Technologies, Paul K Chu (Ed.), [Online]. Retrieved from the Internet: <URL:http://www.intechopen.com/books/advances-in-solid-state-circuit-technologies/dimension-increase-in-metal-oxide-semiconductor-memories-and-transistors>, (2010), pp. 307-332.

Uemura, Tetsuya, et al., "Design and Analysis of Resonant-Tunneling-Diode (RTD) Based High Performance Memory System", IEICE Trans. Electron. vol. E82-C, No. 9, (Sep. 1999), pp. 1630-1637.

"International Application Serial No. PCT/US2015/020193, International Search Report mailed Jun. 18, 2015", 2 pgs.

"International Application Serial No. PCT/US2015/020193, Written Opinion mailed Jun. 18, 2015", 8 pgs.

Baba, Toshio, "Development of Quantum Functional Devices for Multiple-Valued Logic Circuits", 29th IEEE International Symposium on Multiple-Valued Logic, (May 1999), 2-9.

Beresford, R., et al., "Resonant Interband Tunneling Device with Multiple Negative Differential Resistance Regions", IEEE Electron Device Letters, 11(3), (Mar. 1990), 110-112.

(56) References Cited

OTHER PUBLICATIONS

Capasso, Federico, et al., "Quantum Functional Devices: Resonant-Tunneling Transistors, Circuits with Reduced Complexity, and Multiple-Valued Logic", IEEE Transactions on Electron Devices, 36(10), (Oct. 1989), 2065-2082.

Jin, N., et al., "Improved vertically stacked Si/SiGe resonant interband tunnel diode pair with small peak voltage shift and unequal peak currents", Electronics Letters, 40(24), (Nov. 25, 2004), 1548-1550.

Jin, N., "pnp Siu Resonant interband tunnel diode with symmetrical NDR", Electronics Letters, 37(23), (Nov. 8, 2001), 1412-1414.

Jin, Niu, et al., "Tri-State Logic Using Vertically Integrated Si-SiGe Resonant Interband Tunneling Diodes With Double NDR", IEEE Electron Device Letters, 25(9), Sep. 2004), 646-648.

Kao, Y. C. et al., "Vertical integration of structured resonant tunneling diodes on InP for multi-valued memory applications", Fourth International Conference on Indium Phosphide and Related Materials, (Apr. 1992), 489-492.

Seabaugh, Alan C., et al., "Nine-State Resonant Tunneling Diode Memory", IEEE Electron Device Letters, 13(9), (Sep. 1992), 479-481.

Sen, Susanta, et al., "Resonant Tunneling Device with Multiple Negative Difkrential Resistance: Digital .and Signal Processing Applications with Reduced Circuit Complexity", IEEE Transactions on Electron Devices , 34(10), (Oct. 1987), 2185-2191.

Tanoue, T. et al., "A triple-well resonant tunneling diode for multiple-valued logic application", IEEE Electron Device Letters, (8), (Aug. 1988), 365-367.

Van Der Wagt, J. P., et al., "RTD/HFET Low Standby Power SRAM Gain Cell", IEEE Electron Device Letters, 19, No. 1, (Jan. 1998), 7-8.

Van Der Wagt, J. P. A., "Tunneling-Based SRAM", Proceedings of the IEEE, 87(4), (Apr. 1999), 571-595.

Van Der Wagt, J. Paul A, et al., "Multibit Resonant Tunneling Diode SRAM Cell Based on Slew-Rate Addressing", IEEE Transactions on Electron Devices, 46(1), (Jan. 1999), 55-62.

\* cited by examiner

COMPACT MEMORY STRUCTURE INCLUDING TUNNELING DIODE

CLAIM OF PRIORITY

This patent application claims the benefit of priority of each of (1) Berger, U.S. Provisional Patent Application Ser. No. 61/951,959, titled "MEMORY STRUCTURE INCLUDING RESONANT INTERBAND TUNNELING DIODE (RITD)," filed on Mar. 12, 2014; (2) Berger, U.S. Provisional Patent Application Ser. No. 61/975,469, titled "COMPACT MEMORY STRUCTURE INCLUDING TUNNELING DIODE," filed on Apr. 4, 2014; (3) Berger, U.S. Provisional Patent Application Ser. No. 61/984,492, titled "COMPACT MEMORY STRUCTURE INCLUDING TUNNELING DIODE," filed on Apr. 25, 2014; and (4) Berger, U.S. Provisional Patent Application Ser. No. 62/048,526, titled "COMPACT MEMORY STRUCTURE INCLUDING TUNNELING DIODE," filed on Sep. 10, 2014; the entirety of each of which is hereby incorporated by reference herein.

BACKGROUND

Solid-state electronic memories are used widely across many hardware platforms, including embedded systems, mobile devices, desktop computers, and servers. Such memories can be classified in different ways, such as according to whether such memories are "volatile" or "non-volatile." Generally, non-volatile memories can reliably retain state after removal of input power. Conversely, volatile memories generally retain their state only when powered. In particular, volatile memories can be sub-classified as either static or dynamic. A static memory generally retains its state indefinitely when powered. By contrast, a dynamic memory may slowly lose its state, such as due to leakage of a storage structure within the dynamic memory. Accordingly, dynamic memories are generally "refreshed" in a manner where the state of the memory is read and then written back to the storage structure in order to preserve state.

Despite the inconvenience of refresh, dynamic random access memories (DRAM) have achieved tremendous adoption due to the ability to fabricate extremely dense arrays of such memories using relatively simple memory cell structures. For example, a single bit DRAM cell can be fabricated using as little as a single transistor and a single storage structure (e.g., a capacitor). FIG. 1A illustrates a simple schematic representation of a one-transistor one-capacitor (1T-1C) DRAM cell 100A. FIGS. 1B, 1C, 1D, 1E, 1F, and 1G illustrate generally a variety of 1T-1C DRAM structures 100B, 100C, 100D, 100E, 100F, and 100G that can be fabricated using semiconductor processing techniques, such as using a silicon complementary-metal-oxide-semiconductor (CMOS) process. FIGS. 1A through 1G can each include a bit line (BL) node 108, a word line (WL) node 106, a storage node 102, and a plate node 104. As transistor geometries have shrunk, area inefficient planar capacitor structures, such as shown in FIG. 1B, have given way to a variety of other capacitor geometries. Such geometries include more efficient stacked configurations (e.g., FIG. 1C), horizontally-finned or concentric cylindrical structures (e.g., FIGS. 1D and 1E), or trenched configurations (e.g., FIGS. 1F and 1G).

FIGS. 2A, 2B, 2C, 2D, 2E, and 2F illustrate generally a series of fabrication operations 200A, 200B, 200C, 200D, 200E, and 200F that can be used to provide a concentric cylindrical capacitor configuration, such as similar to FIG. 1E. While the configurations shown in FIGS. 1B through 1G and FIGS. 2A through 2F have increased area efficiency as compared to first-generation planar structures, scaling limits may exist. Such capacitor structures have also been enhanced by inclusion of a high-relative-dielectric-constant (e.g., "high-K") material, such as a film, as a portion of a plate of the capacitor structure. Such materials can include $Ta_2O_5$, $Al_2O_3$, or $HfO_2$. Such techniques have enabled single-die DRAM devices to achieve densities providing a gigabit (e.g., about $10^9$ bits) of storage in a single device.

By contrast, FIG. 3 illustrates a schematic representation of a six-transistor (6T) static random access memory (SRAM) cell 300. Such an SRAM cell 300 can offer advantages of low latency, and a lack of requiring refresh (e.g., SRAM can be referred to as "refresh-free"), but at a cost of significantly higher bit-cell complexity. In FIG. 3, transistors M1, M2, M3, and M4 can provide a cross-coupled inverter pair configuration. Transistors M6 and M5 can be controlled using a word line (WL), such as to couple the cross-coupled inverter pairs to a bit line (BL) and an inverted bit line (e.g., BL Bar or "BLB").

OVERVIEW

The present inventor has recognized, among other things, that a semiconductor device exhibiting negative differential resistance (NDR) can be used instead of, or in addition to, a capacitor in a memory bit cell. In an example, an active load (e.g., a transistor-based load) can be used along with tunneling devices exhibiting NDR to provide a memory structure having a footprint comparable to a 1T-1C DRAM cell, but without requiring a periodic refresh to maintain a bit state while powered. Moreover, a series of NDR devices can be cascaded, such as to provide a multi-bit memory cell having a footprint comparable to a single-bit cell, such as by physically stacking the NDR devices. In an example, one or more tunneling devices can be configured to provide a substantially symmetric current-voltage relationship when biased positively or negatively with respect to a reference voltage. Such a symmetric current-voltage relationship can include negative differential resistance regions in the both the positive and negative bias regimes, such as to support desired memory cell latching behavior.

In an example, a separate capacitor structure can be included in the memory cell structure, such as to provide enhanced drive capability. For example, a multi-bit cell having multiple tunneling devices can be supported by a single capacitor structure (such as a capacitor topology similar to a DRAM cell), providing enhanced density as compared to a 1T-1C DRAM structure, and without requiring refresh, unlike the DRAM structure. In an illustrative example, a symmetric tunneling device can include resonant inter-band tunnel diode (RITD) structures. An RITD structure can be fabricated using semiconductor processing similar to that used for Complementary Metal-Oxide-Semiconductor (CMOS) device fabrication, such as including silicon. Multiple RITD structures can be stacked, such as to provide a desired symmetric NDR behavior as mentioned above and elsewhere.

Heterogeneous or alloy material combinations can be included as a portion of one or more RITD structures, such as can include, for example, Silicon, Germanium, Carbon, Tin, or combinations thereof. The examples herein can be applied, for example, to stand-alone memory technology devices, or co-integrated with logic, such as for use as a high-speed cache or memory in a processor circuit or System-on-Chip (SoC).

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As CMOS device dimensions become smaller, quantum and small-scale effects increasingly dominate and may limit further enhancement to CMOS technology. For example, gate oxide tunneling, dopant or other localized fluctuation, or channel quantization effects can limit scalability and performance of CMOS technology. Accordingly, the present inventor has recognized, among other things, that device structures exhibiting negative differential resistance (NDR), such as tunneling devices, can be integrated with generally-available CMOS processing technology, such as to enhance the performance of CMOS devices or to provide hybrid devices including both generally-available CMOS device structures along with tunneling device structures. In particular, such "hybrid" devices can be used to realize area-efficient memory cell structures. Drive current limitations of tunneling device structures can be addressed by using capacitor structures coupled to the tunneling device structures. In this manner, latching behavior and a capacitive storage contribution can be provided by the tunneling device structure. The tunneling device structure, in concert with a separate storage capacitor, can provide boosted drive current capability as compared to a stand-alone tunneling device.

Tunnel diodes can be grouped into two general classifications. Intraband tunnel diodes, which include resonant tunneling diodes (RTD), generally exhibit NDR in both forward and reverse bias conditions, thus allowing two back-to-back RTDs to form a latch structure taking advantage of the "symmetric" NDR characteristics of each of the RTDs. Such RTDs can be used in memory cell examples herein. By contrast, interband tunnel diodes, which include resonant interband tunneling diodes (RITD), exhibit NDR only in the forward bias condition. Thus, to form the specified back-to-back NDR latch, four RITDs, comprised of two pairs of RITDs can be serially connected back-to-back and connected in between with a low resistance p-n junction undergoing Zener tunneling at zero reverse bias (e.g., as a backwards diode). This connective p-n junction between the pairs of RITD structures does not require NDR in forward bias, although it could exhibit such NDR behavior. This connective p-n junction can also be used to address a polarity mismatch of the successive junctions used elsewhere for the RITD structures.

Integrated Memory Cell Structures

Figure 1A:
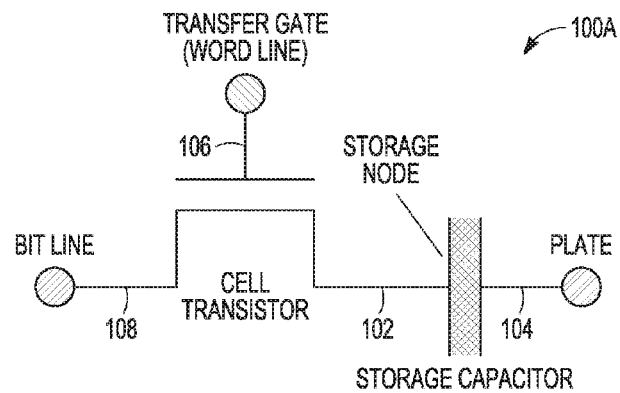
FIGS. 1A, 1B, 1C, 1D, 1E, 1F, and 1G illustrate generally a variety of 1T-1C DRAM configurations.
Figure 1B:
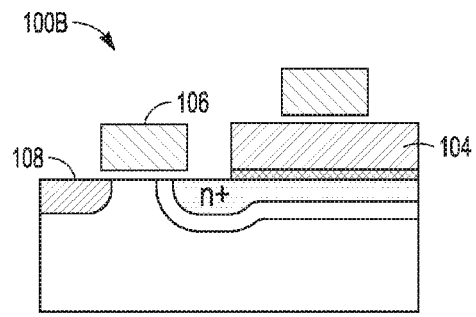
Figure 1C:
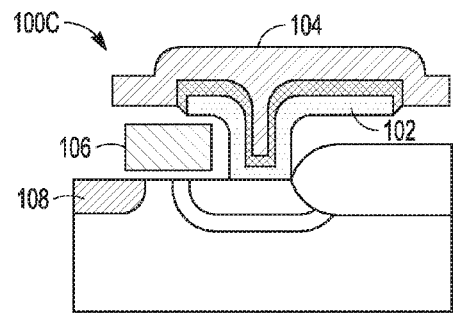
Figure 1D:
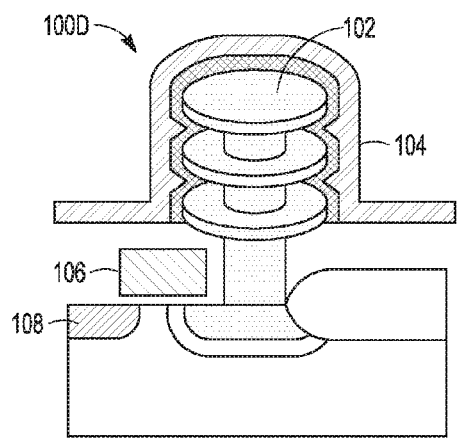
Figure 1E:
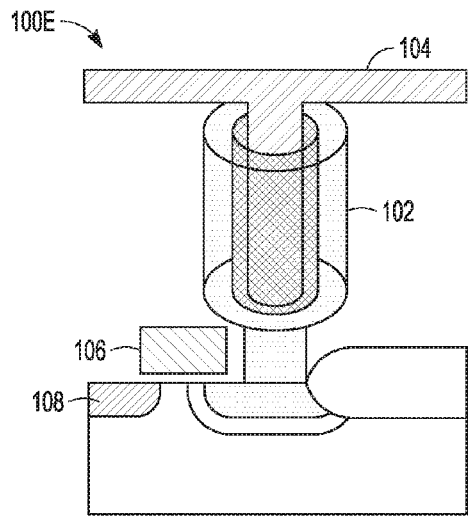
Figure 1F:
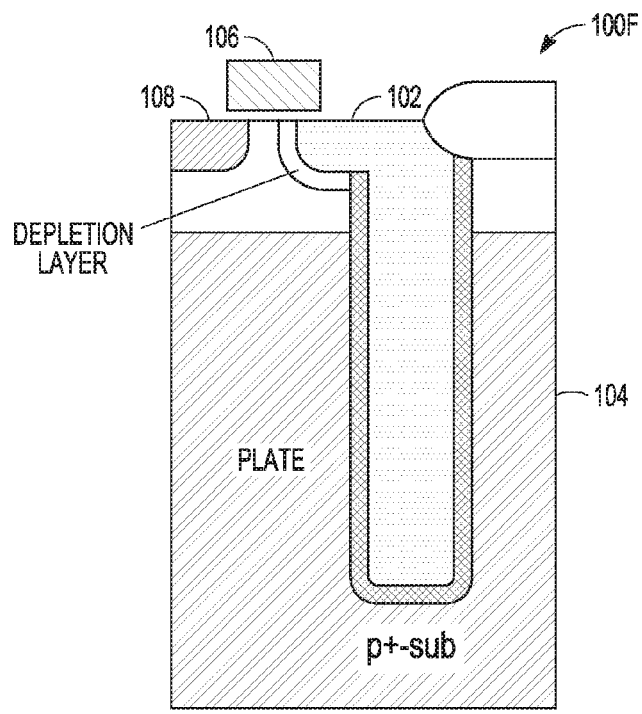
Figure 1G:
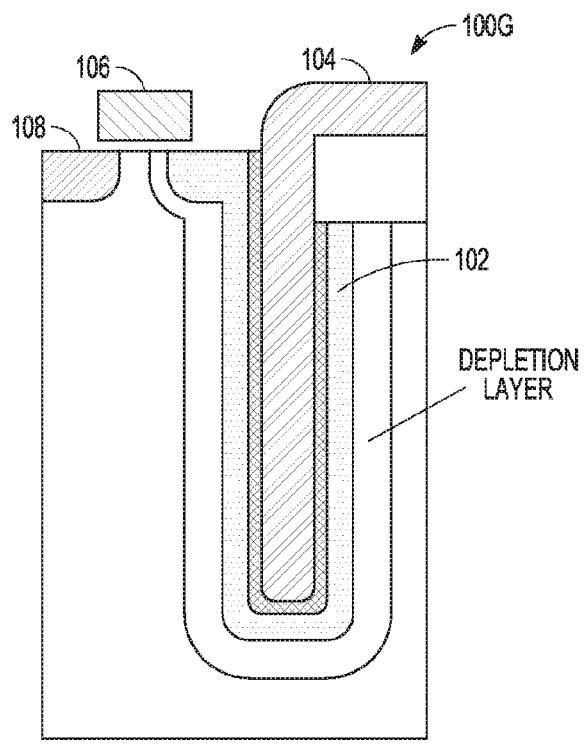
Figure 2A:
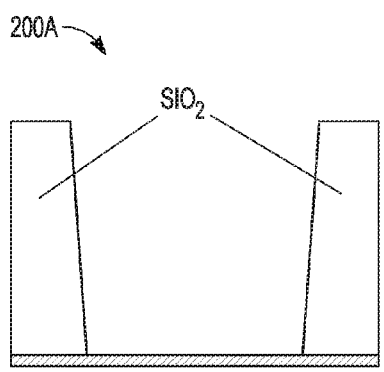
FIGS. 2A, 2B, 2C, 2D, 2E, and 2F illustrate generally a series of fabrication operations that can be used to provide a concentric cylindrical capacitor configuration, such as similar to FIG. 1E.
Figure 2B:
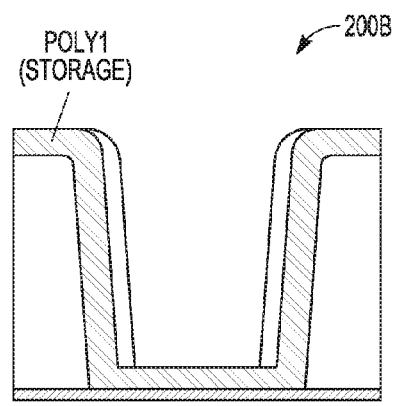
Figure 2C:
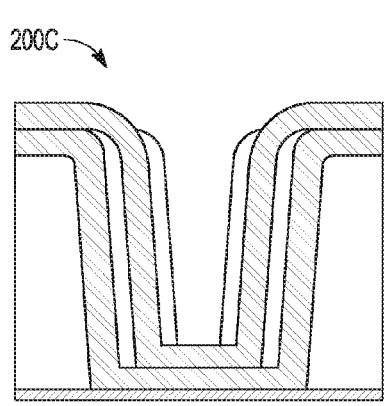
Figure 2D:
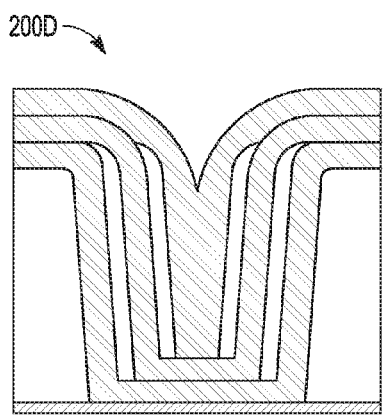
Figure 2E:
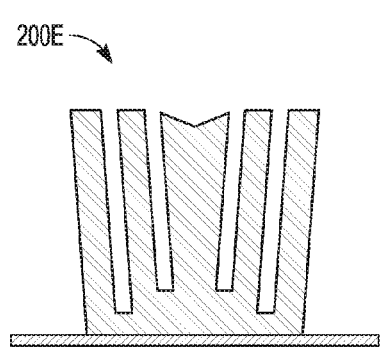
Figure 2F:
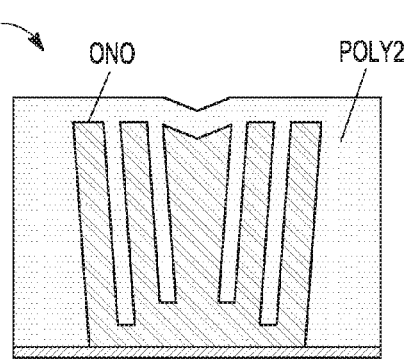
Figure 3:
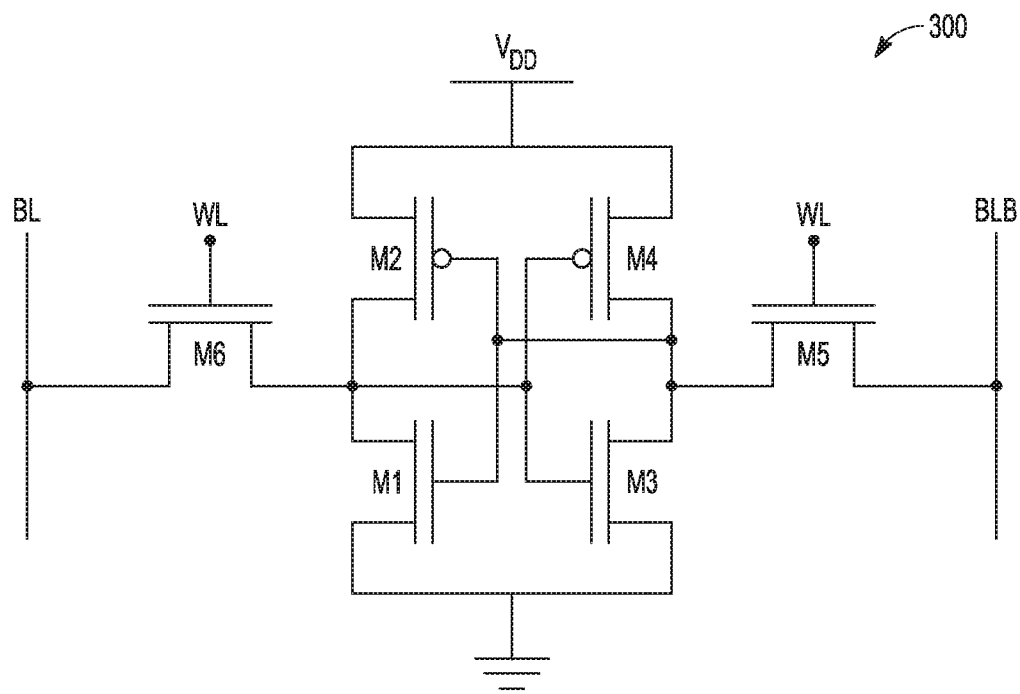
FIG. 3 illustrates a schematic representation of a six-transistor (6T) static random access memory (SRAM) cell.
Figure 4:
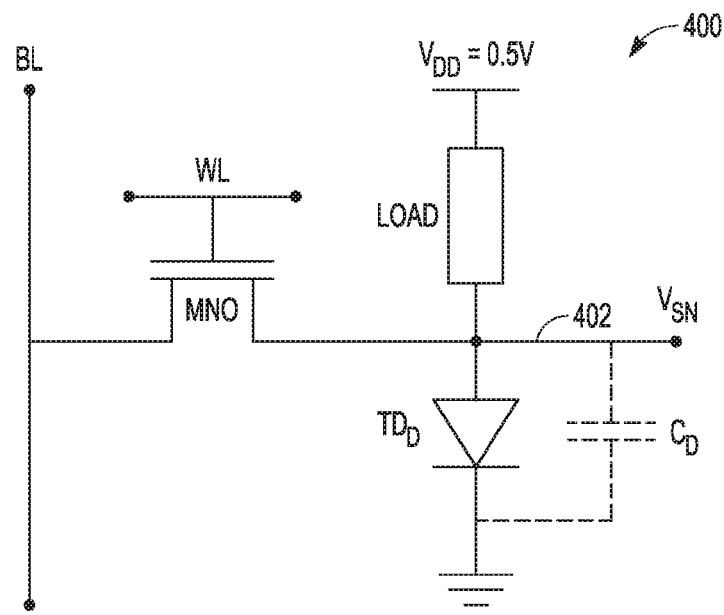
FIG. 4 illustrates generally a generic memory cell structure, such as can include a tunneling device having negative differential resistance (NDR). Latch points for various drive configurations are shown illustratively below in FIGS. 5A, 5B, and 5C illustrate generally latch points for various drive configurations, such as can be shown using respective load lines plotted on top of respective current-voltage (I-V) curves, where the I-V curves exhibit NDR.

FIG. 4 illustrates generally a generic memory cell structure 400, such as can include a tunneling device having negative differential resistance (NDR). In an example, a driver tunnel diode $TD_D$ can be connected to a storage node (SN) 402 having a voltage represented by $V_{SN}$. A load can be connected to the storage node. The load can include another NDR device such as a tunnel diode; a resistive load; or an active load such as a field-effect transistor (FET). A write access transistor MN0 can be controlled such as using a wordline (WL) coupled to a gate of the transistor MN0. The transistor can then couple the storage node 402 to a bitline (BL). A parasitic capacitance $C_D$ intrinsic to the tunnel diode can be established by one of the tunnel devices, such as to provide storage of a bit state (or to provide at least a portion of such storage as discussed in relation to other examples herein). The present inventor has recognized, among other things, that challenge can exist if such an intrinsic $C_D$ capacitance is insufficient to store or maintain a desired state. Accordingly, the present inventor has also recognized that the intrinsic $C_D$ capacitance can be augmented with an explicit capacitor, such as in a trench or stacked configuration, added in parallel with the driver. The driver can include a single negative differential resistance device, or multiple negative differential devices stacked or serially connected electrically.

Figure 5A:
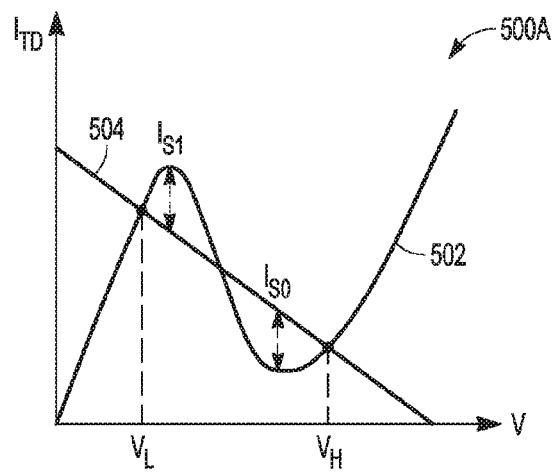
Figure 5B:
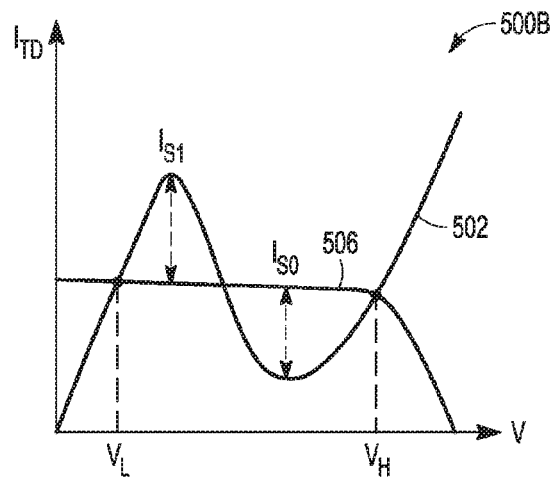
Figure 5C:
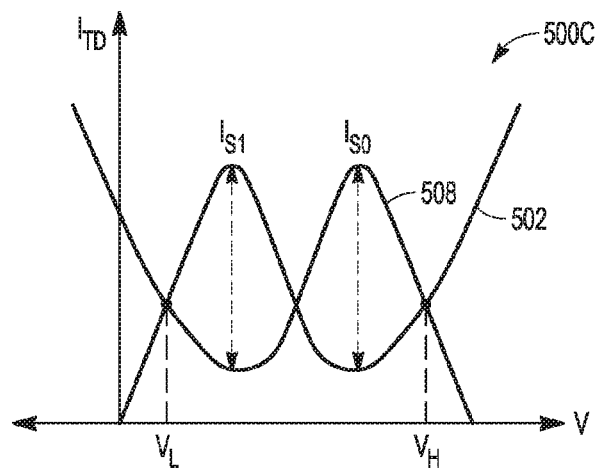

FIGS. 5A, 5B, and 5C illustrate generally latch points (e.g., corresponding to voltages $V_L$ and $V_H$) for various drive configurations, such as can be shown using respective load lines 504, 506, or 508 plotted on top of respective current-voltage (I-V) curves 502, where the I-V curves 502 exhibit NDR. For example, in FIG. 5A, a plot 500A includes a resistive load line 504. In FIG. 5B, a plot 500B includes a transistor driver load line 506 (e.g., such as corresponding to a FET). In FIG. 5C, a plot 500C includes a tunnel diode load characteristic 508 and a tunnel diode driver I-V curve 502. In each case, corresponding charging current ($I_{SO}$) and discharging current ($I_{SI}$) are also shown. The illustrations of FIGS. 5A, 5B, and 5C can describe operation of a generic memory cell topology 400 such as shown in FIG. 4.

FIG. 5C illustrates generally that a combination of a tunnel diode load ($TD_L$) and tunnel diode driver ($TD_D$) can provide significant $I_{SO}$ and $I_{SI}$ magnitudes. For example, with a pair of tunneling devices, two latch points can be supported, such as a logic "0" in the region of less than about 0.1V (e.g., before peak tunneling current), and a logic "1" near a valley of the tunneling current at about 0.4V. In this manner, an operating voltage range can be established below 0.5V, such as with a voltage swing of about 0.33V, fully integrated with CMOS devices elsewhere on a commonly-shared integrated circuit. Such a low operating voltage swing, and high area efficiency generally illustrate tunneling structure (e.g., RITD) desirability, such as for use in a memory cell. While the example above refers to using two states, other numbers of states can be used. For example, tri-state, quad-state, or even penta-state configurations can be used, such as using a 0.5V supply range for the first two states and roughly 0.5V for each additional state. As a number of states increases, a decrease in noise immunity or noise-related instability may result. Examples of multi-bit cell topologies are illustrated generally in FIGS. 8A through 8C.

Figure 6B:
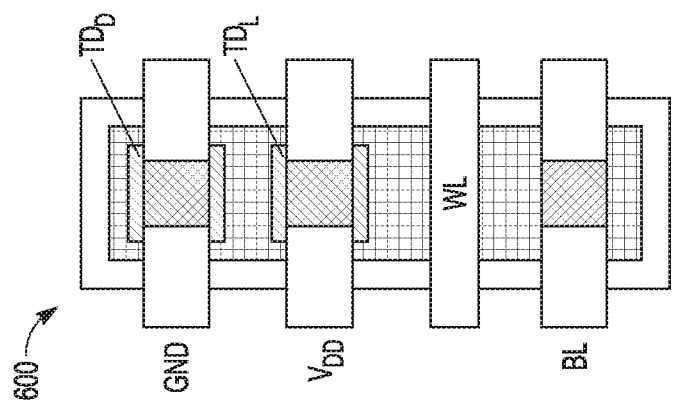
FIG. 6B illustrates generally an illustrative example that can include a view of an integrated circuit layout corresponding to the schematic representation of FIG. 6A.
Figure 6A:
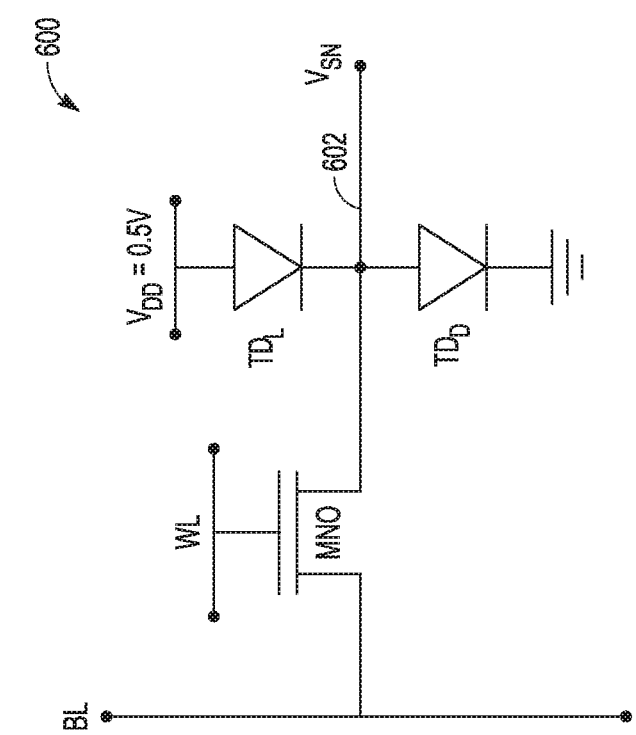
FIG. 6A illustrates generally an illustrative example that can include a single bit cell comprising two or more semiconductor device structures having NDR.

FIG. 6A illustrates generally an illustrative example 600 that can include a single bit cell comprising two or more semiconductor device structures having NDR and FIG. 6B illustrates generally an illustrative example 600 that can include a view of an integrated circuit layout corresponding to the schematic representation of FIG. 6A.

In an example, a memory cell (e.g., a random access memory (RAM) cell) can be fabricated to include two or more semiconductor device structures having a negative differential resistance (NDR), such as to provide a single-bit or multi-bit memory cell. A single bit cell is shown illustratively in the examples 600 of FIGS. 6A (schematic) and 6B (e.g., an overhead view of an integrated circuit memory cell layout). As discussed elsewhere herein, a pair of negative differential resistance devices (shown schematically as diodes) can be arranged back-to-back to form a latch. Each of the diodes $TD_L$ and $TD_D$ can include a substantially symmetric current-to-voltage relationship. For example, the $TD_L$ device and the $TD_D$ device can each include a pair of RITD devices to provide such symmetry. As mentioned above, a parasitic capacitance can be provided as a portion of one of the tunnel devices, such as to provide storage of a bit state (or to provide at least a portion of such storage as discussed in relation to other examples herein). Such storage can be augmented or even provided primarily by an "external" capacitor (e.g., an integrated capacitor providing a capacitance separate from a parasitic capacitance of the tunneling device).

The cell of FIGS. 6A and 6B (e.g., a one-transistor two-tunnel-diode or 1T-2TD cell) can use a DRAM-like read/write topology (e.g., such as can include a transistor MN0 having an input coupled to a word line (WL), and having a bit line (BL) for transfer of charge between a storage node 602 (e.g., using a capacitance provided by $TD_D$) and the bit line, or using an "external" capacitor. Without being bound by theory, a 1T-2TD cell is expected to consume about 50% less power than a 1.2V 1T-1C DRAM cell, because the 1T-2TD cell can operate using a voltage swing of less than 0.5V if implemented using RITD devices. Similarly, if 1T-2TD is used as a replacement for an SRAM configuration, a power savings of 4.7 times or more can be achieved, along with about a 6-fold reduction in area, if using RITD devices to provide NDR.

Figure 7B:
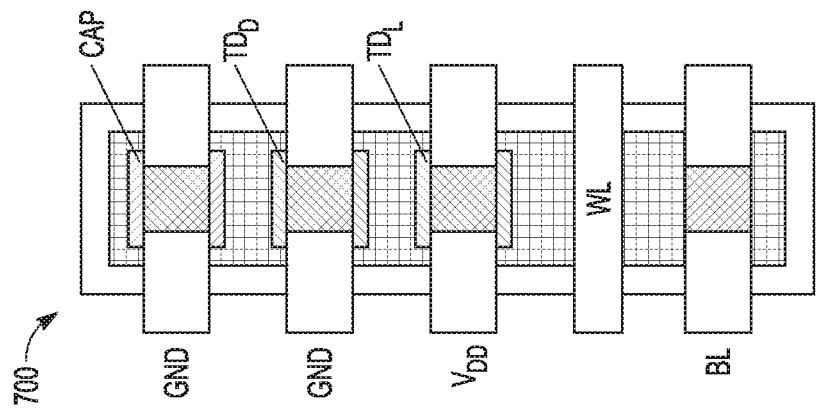
FIG. 7B illustrates generally an illustrative example that can include a view of an integrated circuit layout corresponding to the schematic representation of FIG. 7A.
Figure 7A:
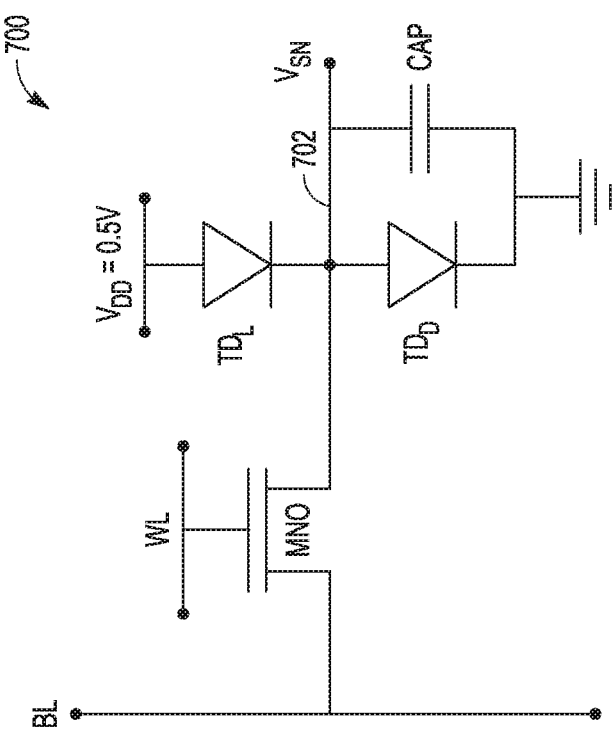
FIG. 7A illustrates generally an illustrative example of a "hybrid" memory cell, such as including one or more device structures exhibiting NDR, a transistor structure as a transmission, and a capacitor structure.

FIG. 7A illustrates generally an illustrative example 700 of a "hybrid" memory cell, such as including one or more device structures exhibiting NDR, a transistor structure as a transmission, and a capacitor structure. FIG. 7B illustrates generally an illustrative example 700 that can include a view of an integrated circuit layout corresponding to the schematic representation of FIG. 7A.

The example 700 of FIGS. 7A and 7B can include one or more device structures exhibiting NDR (e.g., tunneling devices), a transistor structure MN0 as a transmission gate (e.g., "write access transistor"), and a capacitor structure CAP, such as including an integrated capacitor configuration similar to one or more of the generally-available dynamic RAM (DRAM) capacitor structures discussed above. Such a memory cell as shown schematically in FIG. 7A (and as shown illustratively in the layout of FIG. 7B), need not require refresh. A memory structure including NDR structures as shown can retain state when powered, without requiring refresh, eliminating refresh latency and offering characteristics more similar to SRAM while having a DRAM-like footprint.

In the example 700 of FIG. 7A (or other examples), a capacitor generally used for DRAM fabrication, either trench or stacked, for example, can be connected in an electrically parallel configuration with one of the NDR devices. A self-restoring current of the NDR pair can hold a voltage stored on the capacitor (e.g., a bit value), providing refresh-free storage. A tunnel device can provide such NDR and is simple and compact. In an illustrative example, tunnel devices can be vertically stacked upon or nearby a transistor structure, such as to provide enhancement to cell compactness as compared to generally-available DRAM memory cell structures. For example, a load tunnel diode and a driver tunnel diode can be fabricated directly upon a transistor source or drain region, as discussed in various examples below.

If the tunnel devices include RITDs, a standby current density and drive current density, or an RITD Peak-to-Valley Current Ratio (PVCR) may be insufficient to meet a desired level of power efficiency or performance. The present inventor has recognized, among other things, that the 1T-2TD example 600 of FIGS. 6A and 6B can be modified, such as to provide the "hybrid" cell example 700 of FIGS. 7A and 7B, including a capacitor CAP (e.g., an integrated capacitor similar in architecture to capacitors used generally in DRAM cell configurations) separate from the parasitic capacitance provided by the RITD.

In an illustrative example, a standby leakage current density criterion can be on the order of about 6 milliamps per square centimeter (mA/cm$^2$). RITD structures have been fabricated having peak current densities as low as 20 mA/cm$^2$, and accordingly a valley current below a 6 mA/cm$^2$ threshold is feasible. However, a minimum drive current criterion can also be stringent, such as on the order of greater than 0.4 megaamps per square centimeter (MA/cm$^2$). RITD structures have been fabricated having peak current densities higher than 0.2 MA/cm$^2$. The present inventor has recognized that such high drive current need not be provided exclusively by an RITD.

For example, as shown in FIGS. 7A and 7B, an integrated capacitor CAP (such as using a capacitor structure similar to capacitors generally used for CMOS DRAM structures) can be used, such as in a parallel configuration with one or more TDs, or otherwise connected to a commonly-shared storage node 702 along with one or more TDs. Size and area savings can still be achieved using one or more RITDs because a TD capacitance can contribute to the storage capacitance of the cell, so the integrated capacitor separate from the TD can have a lower capacitance as compared to an example lacking a TD. A standby current of the structure illustrated in FIG. 7A can be about 0.043 times a normalized standby current of a 1T-1C DRAM cell, with an area and drive current comparable to a 1T-1C DRAM cell, while providing a benefit of not requiring refresh. The structure shown in FIG. 7A also reduces or eliminates a need for a large PVCR in the TD devices.

Other techniques can be used to further enhance area efficiency of a memory cell including a tunneling device. For example, FIGS. 6A through 6B and 7A through 7B illustrate generally a single-bit cell topology. A multi-bit cell can be formed, such as using multiple tunneling devices that can be one or more of physically or electrically stacked, such as shown in the examples of FIGS. 8A through 8E.

Figure 8A:
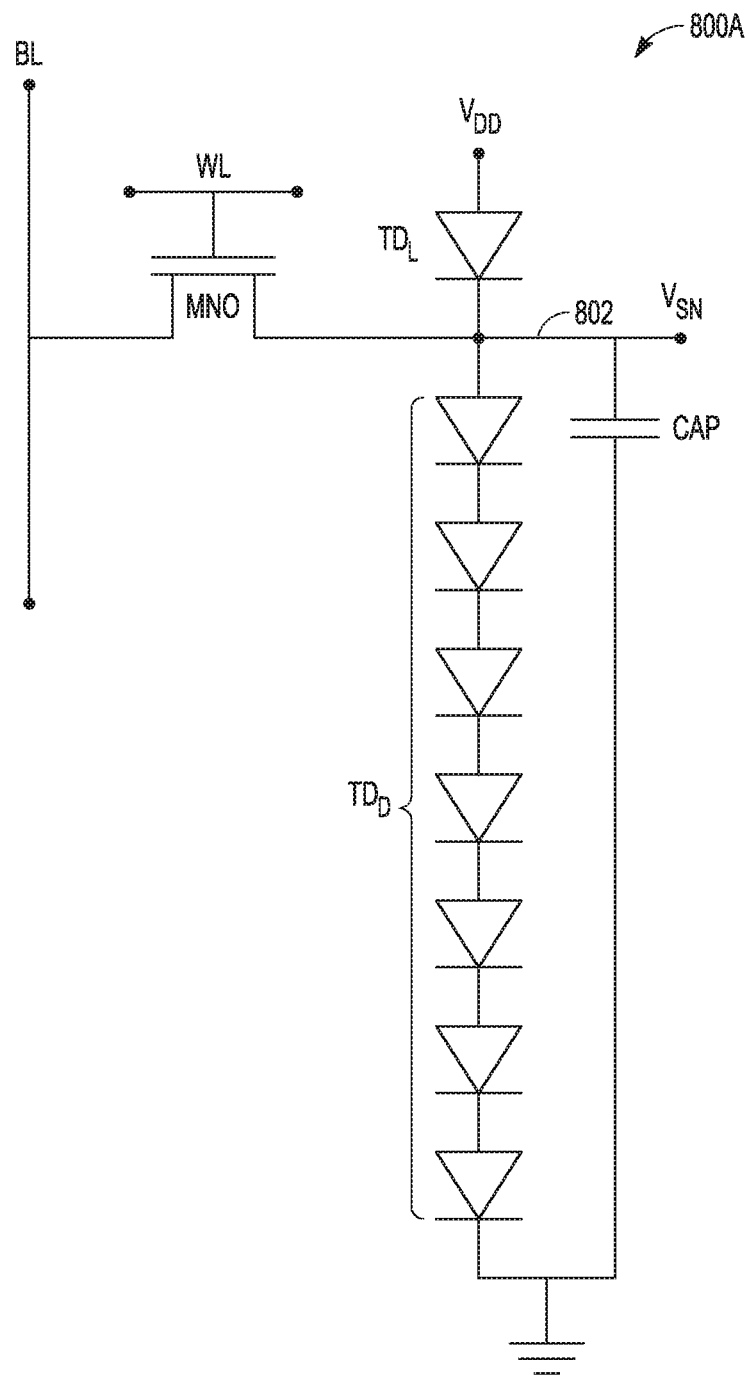
FIGS. 8A and 8B illustrate generally illustrative examples of multi-bit cells, such as can include multiple tunneling devices that can be one or more of physically or electrically stacked.
Figure 8C:
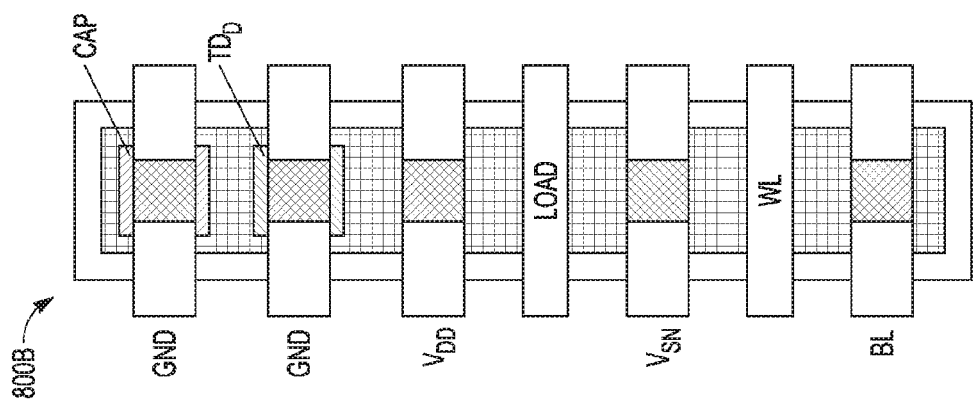
FIG. 8C illustrates generally an illustrative example that can include a view of an integrated circuit layout corresponding to the schematic representation of FIG. 8B.
Figure 8B:
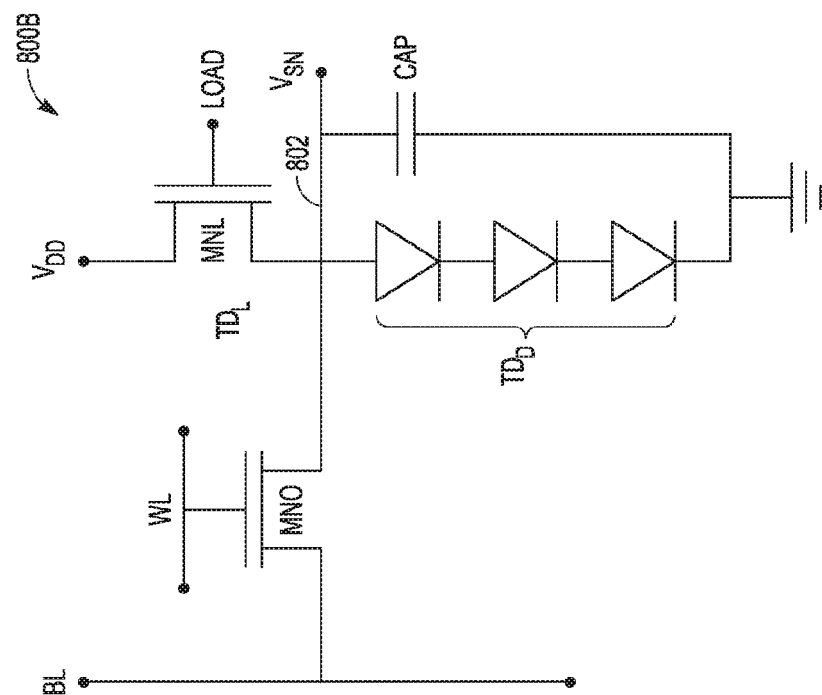

FIGS. 8A and 8B illustrate generally illustrative examples 800A and 800B of multi-bit cells, such as can include multiple tunneling devices that can be one or more of physically or electrically stacked. In FIG. 8A, a stack of devices $TD_D$ having NDR can be arranged to store respective bits. Such devices having a substantially symmetric NDR (e.g., such as serially-connected RITDs) can be fabricated in a physically-stacked configuration having an area comparable to the single-bit 1C-2TD structure of the example 700 of FIGS. 7A and 7B, but providing additional storage bits. In this manner, a normalized area of a multi-bit cell can be a fraction of the corresponding area consumed by a 1T-1C DRAM cell (e.g., a structure having 4 bits of storage would consume only about 0.35 times the area of a 1C-TC DRAM, per bit, and an 8-bit structure would consume only about 0.17 times the area of the 1C-TC DRAM, per bit). In the example of FIG. 8A or 8B, read or write operations can be performed serially such as using a write access transistor MN0 controlled by a wordline (WL) to couple a bitline (BL) to a storage node 802. The present inventor has recognized, among other things, that increasing density by using multiple stacked tunneling structures can provide scale reduction in a manner that is more efficient than attempting to scale down an integrated capacitor of a DRAM cell in the absence of using tunneling devices.

In an example 800B, such as shown illustratively in FIG. 8B, a load device (e.g., $TD_L$ as shown in FIG. 8A) can be replaced with an active load MNL, such as including a FET device (e.g., a metal-oxide-semiconductor FET device), labeled "Load." A corresponding integrated circuit layout of the example 800B is shown illustratively in FIG. 8C. In another example, a three-terminal RITD device (e.g., a "Tunnel FET") can be used in place of the MOS transistor, and can similarly operate using a compressed voltage swing of less than 0.5V per NDR driver element, such as to provide an overall reduction of power consumption of about 80% versus a 1T-1C DRAM cell. Similarly, a power savings of about 25% would be expected in comparison to an 0.8V DRAM cell, if 1T-2RITD cell topology is used, and about 50% if a TFET is used in place of a MOS transistor.

RITD structures, in contrast with Esaki tunneling structures, do not generally require complex alloy processing. Also, RITD structures, in contrast with other resonant tunneling diode structures, do not generally require large conduction band offsets. For example, use of Si/SiGe materials in an RTD (as compared to an RITD), would generally include using a thick relaxed buffer layer to strain engineer a significant enough conduction band offset to create manifest quantum confinement. As discussed further in other examples herein, one or more RITDs can be fabricated in a vertically-stacked configuration, so the examples discussed above can include using a structure having RITDs fabricated in a stacked configuration. The examples described herein are generally compatible with a variety of processes, integrated capacitor, and integrated transistor device structures such as are generally associated with CMOS fabrication.

For example, RITD structures such as shown and described herein can be co-integrated with other silicon-based devices, such as can include digital CMOS transistor circuits at 90 nanometer (nm), 65 nm, 45 nm, 32 nm, 22 nm, 14 nm, or 10 nm process nodes, or beyond. Such process nodes can include use of strained-silicon device configurations, high-K dielectrics, metal gate structures, or other device structures such as multi-gate structures. RITD structures can be fabricated at least in part using thin epitaxial CVD growth, such as to provide an active region about 8 nm thick. In an example, an RITD can be grown sequentially atop SiGe source and drain regions, showing that RITD processing can be easily integrated with planar CMOS fabrication flow.

For multi-valued bit cells such as shown illustratively in FIGS. 8A through 8C, tunnel diodes can be vertically stacked for compactness. For examples including interband tunnel diodes, this creates a polarity mismatch by generating a reverse biased parasitic p-n junction. But, by establishing the appropriate adjoining polarity types, a backward diode can be formed that is actually operating in Zener reverse bias. In this manner, multiple RITDs can be cascaded serially providing multiple NDR regions.

Figure 8D:
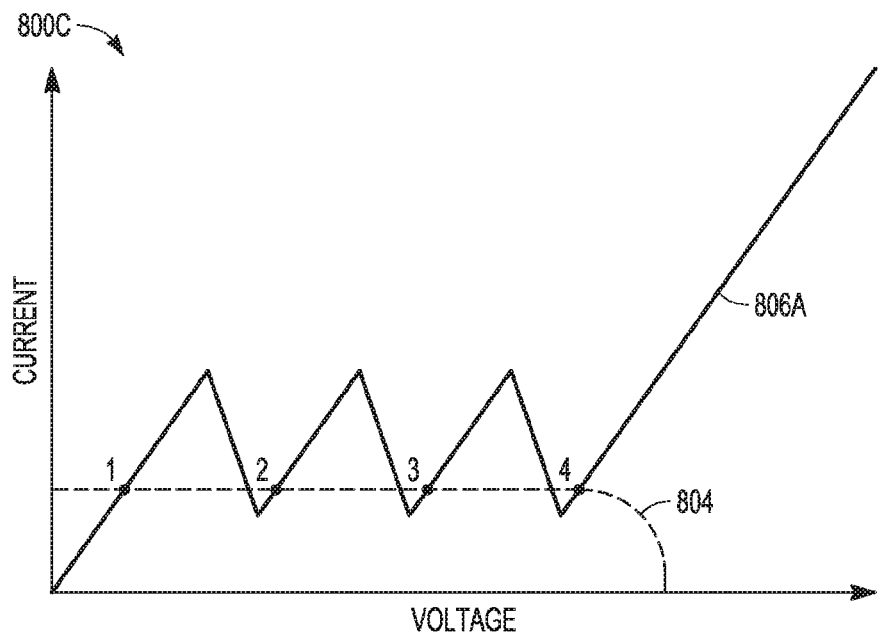
FIGS. 8D and 8E illustrate generally latch points for multi-bit examples.
Figure 8E:
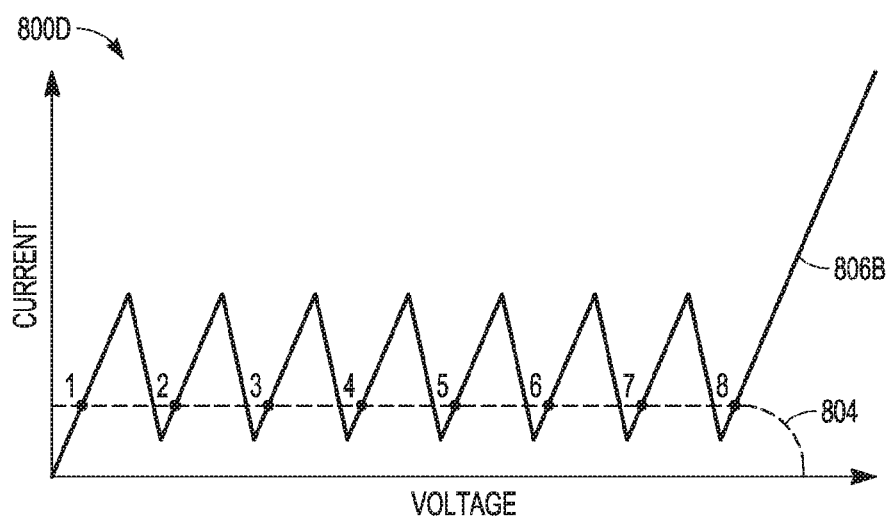

FIGS. 8D and 8E illustrate generally latch points for the multi-bit examples. As an illustrative example, a 1T-1C-3TD cell can be formed using three serially connected tunnel diodes as the driver with a second transistor (separate from the word line gate) being used as the load, such as shown in the example 800B of FIG. 8B. The three serially connected tunnel diodes $TD_D$ can provide three negative differential resistance regions. However, as shown illustratively in the I-V plot 800C of FIG. 8D, the load transistor (or a resistor or other suitable device) manifests with four stable intersection latch points where the load line 804 intersects the stacked tunnel diode I-V curve 806A "humps," thus providing a 4-bit storage cell topology. FIG. 8E extends this to serially connect seven tunnel diodes to create seven negative differential resistance regions. As shown illustratively in the plot 800D similar load line analysis provides for eight stable latch points at the intersection between the transistor load line 804 and the I-V curve 806B of the tunnel diode stack, thus enabling a compact 1T-1C-7TD 8-bit cell.

Figure 9:
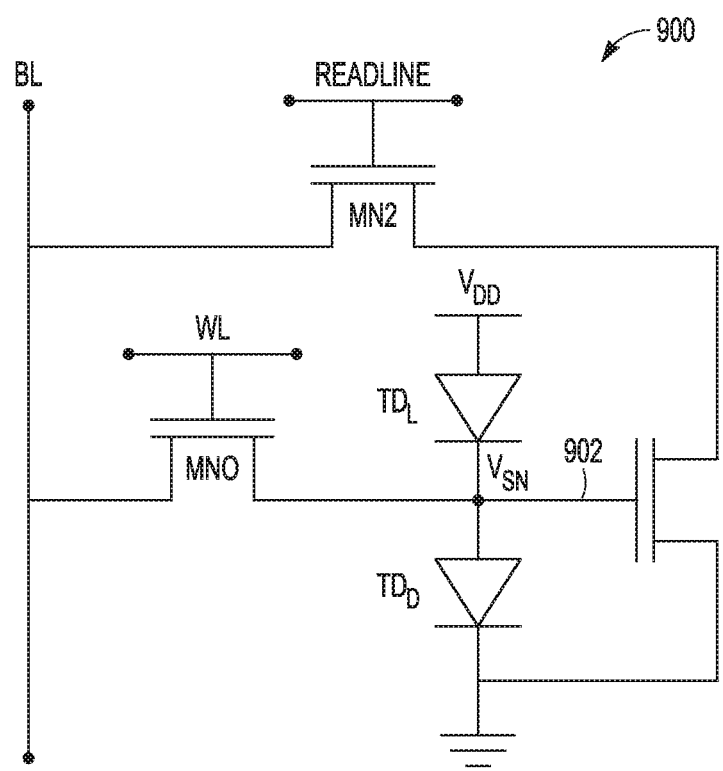
FIG. 9 illustrates generally an illustrative example of a three-transistor two-tunnel-diode (3T-2TD) memory cell having a "gain cell" topology.

Other memory cell topologies can be used. For example, FIG. 9 illustrates generally an illustrative example 900 of a three-transistor two-tunnel-diode (3T-2TD) memory cell having a "gain cell" topology. The tunnel diodes $TD_L$ and $TD_D$ can be symmetric, as in other examples described herein. For example, each of $TD_L$ and $TD_D$ can include a pair of back-to-back interband tunnel devices to provide a symmetric tunnel diode device. The back-to-back tunnel devices can be coupled together using a backward-connected diode (e.g., a pn junction can be established at the interface between back-to-back tunnel device, such as a pn junction configured to operate in a reverse breakdown region as mention in other examples). The gain-cell topology can include a write access transistor MN0 controlled by a wordline (WL) to couple a bitline (BL) to a storage node 902, along with a read transistor MN1 coupled to a read access transistor MN2, the read access transistor MN2 controlled by a readline.

Figure 10A:
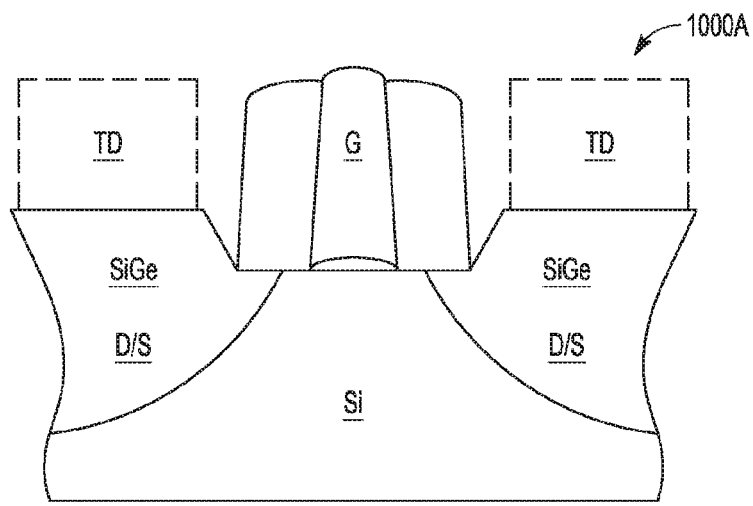
FIG. 10A illustrates generally a side view of a planar CMOS transistor structure (e.g., a FET).

FIG. 10A illustrates generally a section view of a planar CMOS transistor structure 1000A (e.g., a FET). The Si/Ge regions can define drain or source regions (D/S), and conduction through the transistor can be controlled using a gate region (G). A high-K dielectric film can be included as a portion of the gate structure, such as just above a channel region between the drain or source regions (D/S). One or more tunnel devices (TD) can be fabricated, such as upon a Si/Ge drain or source region (D/S) as shown in FIG. 10A. In this manner, various tunneling device structures or stacks of such structures can be fabricated in a highly-integrated fashion compatible with other CMOS processing. For example, the one or more RITD devices can be fabricated in the source or drain regions such using a device structure as shown in one or more of the examples of FIGS. 11A through 11B or 12A through 12B, or other examples, such as to provide a substantially symmetric NDR device for use as a portion of a memory cell.

Figure 10B:
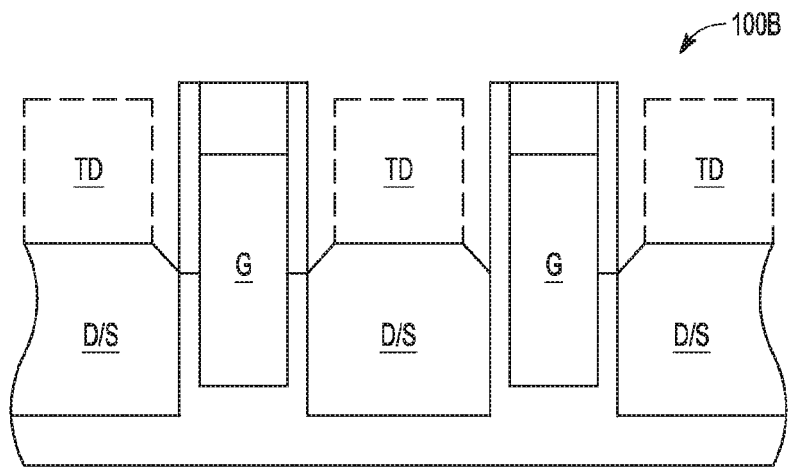
FIGS. 10B and 10C illustrate generally side views of CMOS transistor structures, such as can include FinFET structures.
Figure 10C:
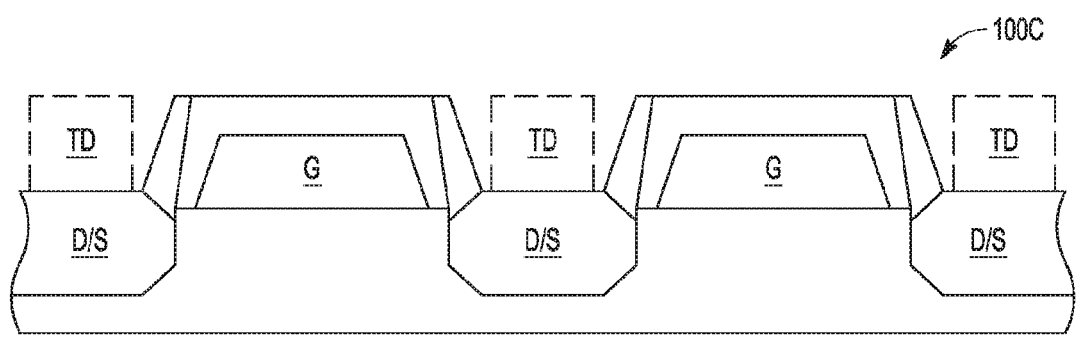

FIGS. 10B and 10C illustrate generally side views of CMOS transistor structures 1000A and 1000B, such as can include FinFET structures.

In an illustrative example, a fin Field Effect Transistor (finFET) can include conformal doping along a raised fin used as a portion of the source or drain structure of the finFET. CVD processing used to fabricate the finFET can be similar to the CVD processing used to form an RITD. In an example where the RITD is connected serially to a drain structure of a transistor (e.g., a drain portion of a finFET), conformal growth of the RITD allows the RITD to be directly connected to the finFET to provide a highly-compact footprint. Examples of side section views (with gate structure penetrating into or out of a plane of the drawing page) of finFET device structures 1000A and 1000B are shown illustratively in FIGS. 10B and 10C and are labeled similarly to the example of FIG. 10A.

Figure 11A:
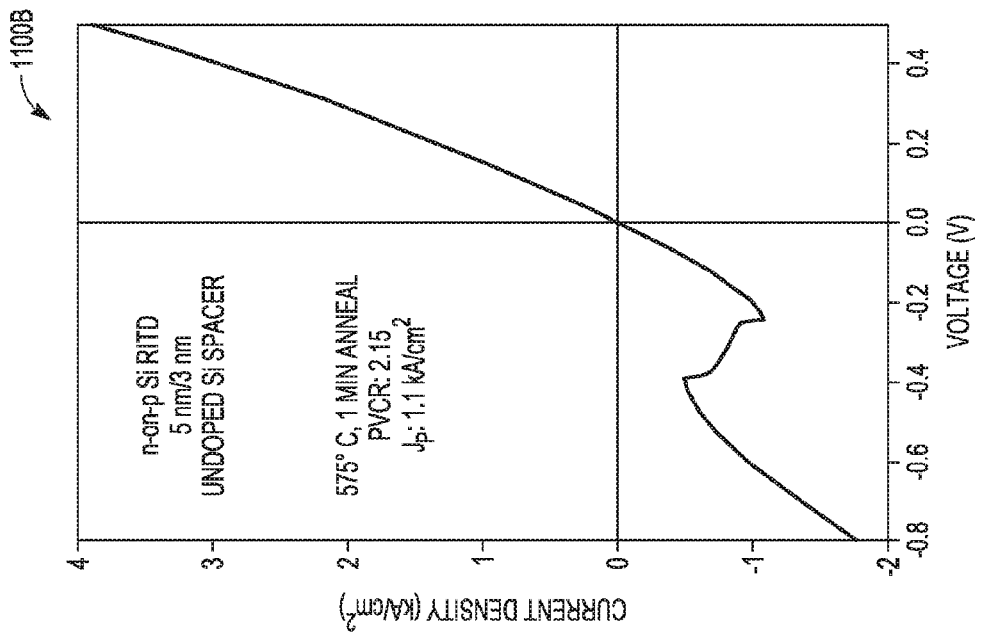
FIGS. 11A and 11B illustrate generally illustrative examples of current-voltage relationships that can be provided by respective resonant interband tunneling diode (RITD) structures.
Figure 11B:
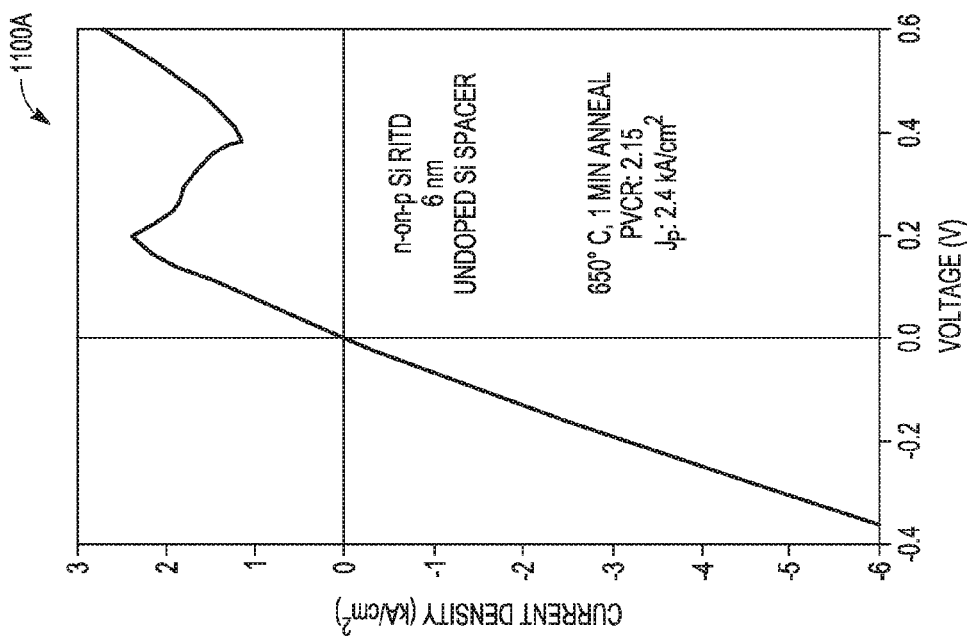

Illustrative Examples of RITD Structures and Techniques for Fabricating RITD Structures FIG. 11A and FIG. 11B show illustrative examples of current-voltage relationships 1100A and 1100B that can be provided by respective RITD structures, such as having processing and geometric conditions as shown inset in the plots of FIGS. 11A and 11B.

Figure 12A:
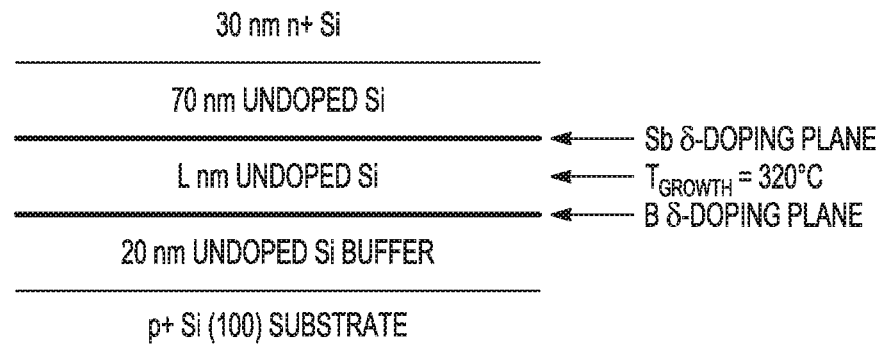
FIGS. 12A and 12B illustrate generally illustrative examples of layer configurations for RITD structures, such as can provide the current-voltage relationships shown illustratively in FIGS. 11A and 11B, respectively.
Figure 12B:
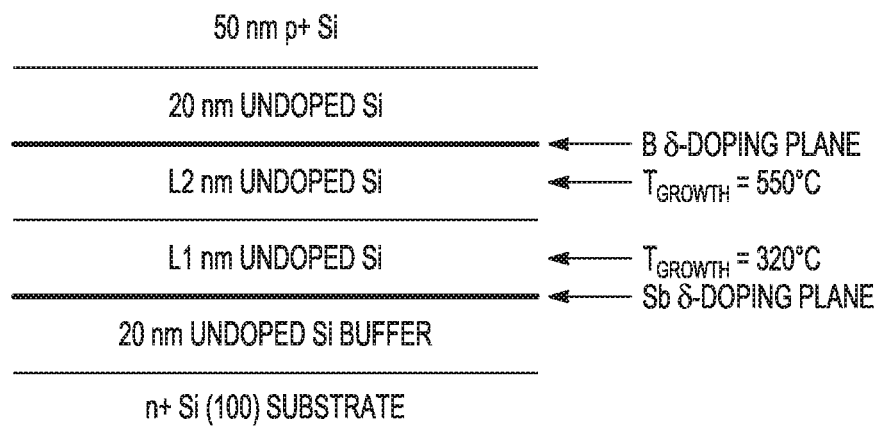

FIGS. 12A and 12B illustrate generally illustrative examples of layer configurations for RITD structures, such as can provide the current-voltage relationships shown illustratively in FIGS. 11A and 11B, respectively. A single n-on-p RITD structure implemented on silicon can include a stack-up similar to FIG. 12A to provide an I-V characteristic 1100A as shown in FIG. 11A. Because quantum mechanical tunneling probability, and therefore the correlated tunneling current density, is exponentially related to tunneling distance, the spacing between the degenerate doping zones generally determines this value. For the delta-doped RITDs illustrated in FIGS. 12A and 12B, this tunneling distance is given by L and L1+L2, respectively. A tunneling distance needed for the specific circuit application can be selected by specifying L and L1+L2 appropriately.

A single p-on-n RITD structure implemented on silicon can include a stack-up similar to FIG. 12B to provide an I-V characteristic 1100B as shown in FIG. 11B. The characteristics 11A and 11B can be referred to as "asymmetric," because such characteristics only show an "N"-shaped negative differential resistance behavior in a single quadrant of the I-V plot. In FIG. 11A, the NDR behavior appears in a positively-biased condition in quadrant (I), and in FIG. 11B, the NDR behavior appears in the negatively-biased condition in quadrant (III). RITD structures can generally provide a peak-to-valley current ratio (PVCR) of up to 5.2, in an illustrative example. According to simulation and analysis, valley current can be determined at least in part by defect current. Illustrative examples of device structures fabricated in laboratory conditions have exhibited acceptable thermal stability of up to 200 degrees C. and beyond, invariant to burn-in, and have shown immunity to radiation exposure.

Figure 13:
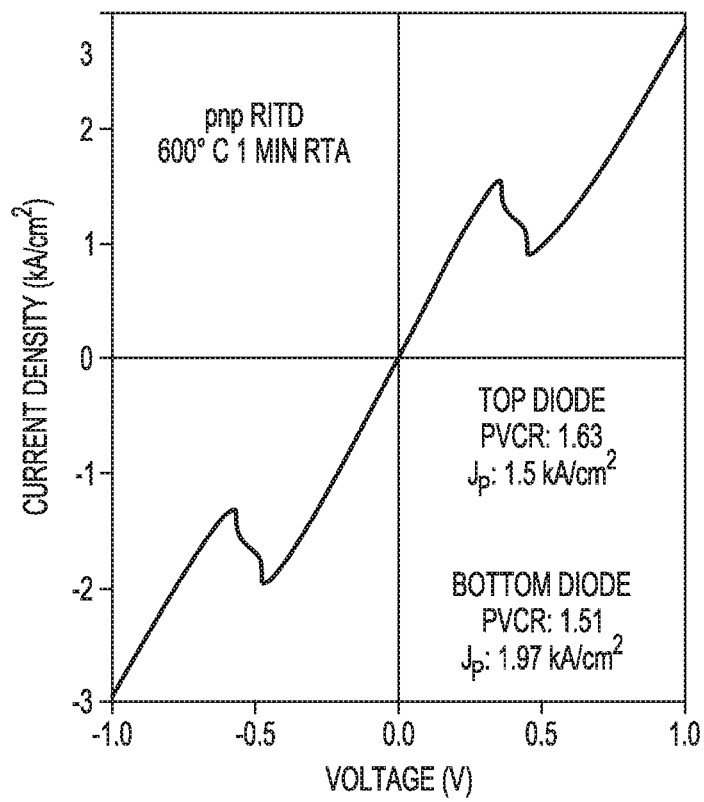
FIG. 13 illustrates generally an illustratively example of a "symmetric" current-voltage relationship, such as can be provided by an RITD structure including two tunneling devices.

FIG. 13 illustrates generally an illustratively example of a "symmetric" current-voltage relationship, such as can be provided by an RITD structure including two tunneling devices. The present inventor has recognized among other things that RITD structures can be stacked, such as to provide a symmetric current-voltage relationship as shown illustratively in FIG. 13. The I-V characteristic 1300 shown in FIG. 13 can be said to be substantially symmetric. In this sense, the structure need not exhibit a literal "mirror image" symmetry, but corresponding NDR behaviors are exhibited in both quadrants (I) and (III).

Figure 14:
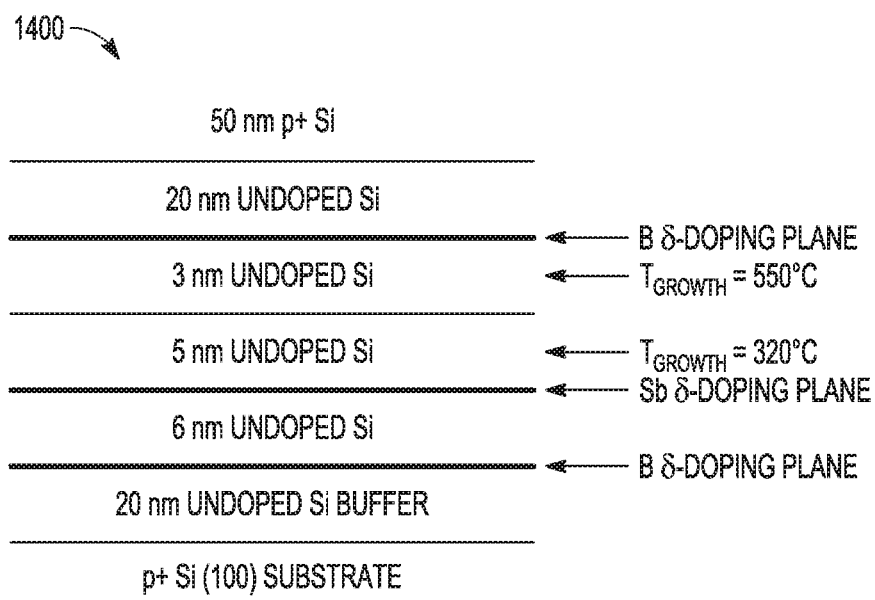
FIG. 14 illustrates generally an illustrative example of a p-n-p RITD structure that can be implemented in silicon.
Figure 15A:
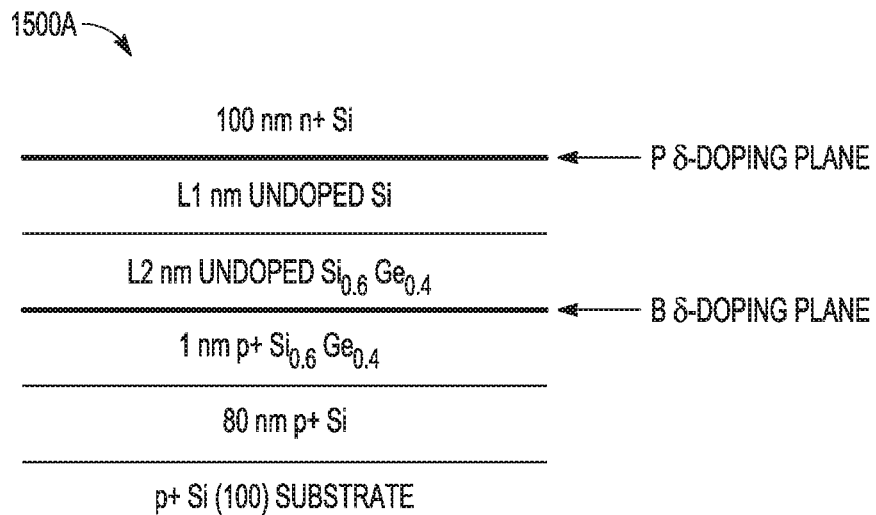
FIG. 15A illustrates generally an illustrative example of an n-on-p RITD stack-up that can include a Si/Ge "cladding" layer, with a tunnel barrier formed by undoped Si and SiGe layers.
Figure 15B:
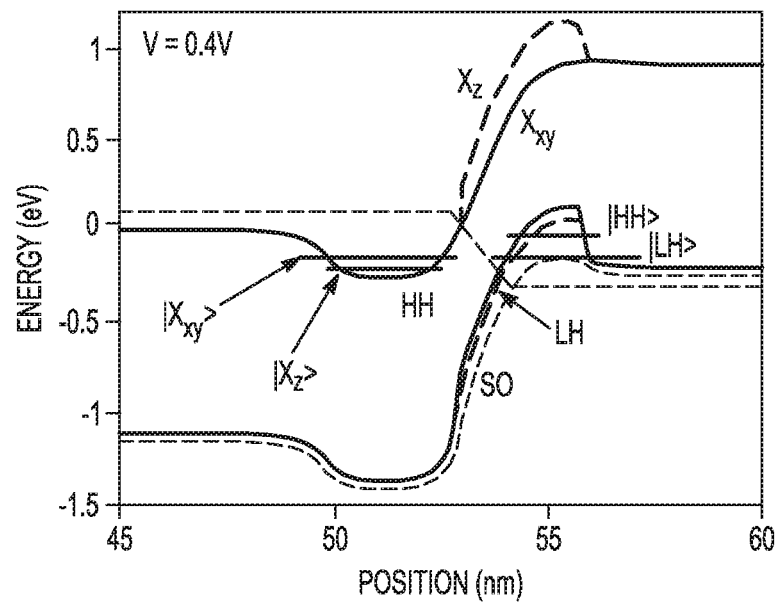
FIG. 15B illustrates generally an illustrative example of a calculated band diagram corresponding to the stack-up shown illustratively in FIG. 15A.

For example, FIG. 14 illustrates generally an illustrative example of a "stacked" p-n-p RITD structure 1400 that can be implemented in silicon, such as to provide a symmetric current-voltage relationship. FIG. 15A illustrates generally an n-on-p RITD stack-up that can include a Si/Ge "cladding" layer, with a tunnel barrier formed by the undoped Si and SiGe layers. By judicious placement of SiGe surrounding the boron (B) delta-doping (δ-doping plane) on both sides, a valence band quantum well is not only preserved, but enhanced. FIG. 15A shows an illustrative example 1500A of a high quality delta-doped RITD with a 6 nm tunneling spacer. The calculated band diagram 1500B of FIG. 15B corresponding to the structure of FIG. 15A clearly indicates the creation of conduction and valence band quantum wells established by effective delta-doping. In an illustrative example, for the structure shown in FIG. 15A, L1 can be 2 nm, and L2 can be 4 nm.

In applications involving memory cell structures, to achieve cell compactness, epitaxially-fabricated tunnel diodes, such as including RITD structures, can be stacked as a p-n-p or n-p-n configuration. For example, a forward bias of a driver RITD and a reverse bias of a load RITD will overlap to form a back-to-back tunnel diode latch (see, e.g., FIG. 5C showing such overlapping responses). Depending upon the hybrid tunneling RAM cell layout, two back-to-back NDR devices (e.g., each including two RITDs to provide symmetric I-V behavior) can be epitaxially defined in separate locations atop a MOS transistor, such as using the source/drain contact as the central "sense" node. In this way, the two NDR devices will be biased oppositely, so that a forward biased NDR region (e.g., of a first interband tunnel diode) intersects another forward biased NDR region (e.g., of a second, inverted, interband tunnel diode). As mentioned above, for examples including RITD devices, each NDR circuit branch can include a pair of RITD devices to provide symmetry. Accordingly, an individual (e.g. "asymmetric") RITD device in a particular branch that is reverse biased simply acts as a short circuit, and thereby effectively disappears from the circuit when in a reverse-biased state.

A delta-doped (δ-doped) RITD can be used as a "building block" device element. Such delta-doped RITD structures can be stitched together to provide the back-to-back interband tunnel diode stack. For example, two back-to-back RITDs can have a p-n-p or n-p-n configuration such as depending upon a conduction type of the transistor on whose source or drain region the stack can be fabricated. For an NMOS conduction type, an n-p-n RITD stack can make co-integration more seamless without introducing an additional energy barrier. Similarly, for a PMOS conduction type, a p-n-p tunnel diode configuration can be used.

Other pairing can also be co-integrated (e.g., p-n-p on NMOS or n-p-n on PMOS), such as by the integration of a Zener tunneling reverse-biased p-n tunneling junction (e.g., a backward diode) located at the interface where there would otherwise be a polarity mismatch. Synthesizing back-to-back interband tunnel diodes as specified above, particularly the p-n-p or n-p-n RITDs, generally involves careful control of dopant incorporation, controlling both diffusion and segregation. Tunnel diodes require doping to exceed the degeneracy condition to manifest their negative differential resistance behavior. Generally, doping well above $10^{19}$ cm$^{-3}$, and even up to and beyond $10^{20}$ cm$^{-3}$, concentration is used to meet such a degeneracy condition. In order to suppress deleterious effects caused by dopant redistribution, which can lower the doping levels below the degeneracy condition needed for quantum tunneling, epitaxial growth conditions are carefully controlled.

For example, where molecular beam epitaxial growth (MBE) is used for fabrication, dopant segregation can be reduced or minimized such as by lowering the substrate temperature during growth of those doping layers that require the degeneracy condition for quantum tunneling, for instance delta-doping in the RITDs, thereby preventing their incorporation into the doped overlayers above in a multilayer RITD stack. Such incorporation can undesirably lead to counter doping consequences. Counter doping can lead to compensation which lowers the effective doping level below the degeneracy condition, rendering the overlaying tunneling devices inoperative. Further, the energy states associated with compensation as well as crystalline vacancies triggered by low adatom mobility on the substrate lead to defect mediated tunneling through the forbidden bandgap. This also lowers the tunneling device performance by reducing the quantum selection rules, thus the peak to valley current ratio will typically reduce. Either a lowering of the substrate temperature during MBE epitaxial growth to a level that is too low, or lower than nominal for too long can both contribute to poor epitaxial quality, so care is generally exercised to selectively reduce the substrate temperature during the problematic layers (e.g., those targeted to meet the degeneracy condition) only.

In an alternate approach, chemical vapor deposition (CVD) can control dopant segregation through reactor pressure, such as toggling between reduced pressure and atmospheric pressure. With a hydrogen containing environment, elevated chamber pressure is one element that suppresses segregation, allowing for higher substrate temperatures during CVD epitaxial growth without the concurrent production of vacancy defects that elevate the valley current.

Generally, p-type dopants, such as boron, do not segregate as badly as n-type dopants, such as Sb, P, or As. So, it is generally the n-type layer for which dopant segregation should be most carefully managed. Counter-intuitively, however, when epitaxially growing a p-layer of a n-p-n interband tunnel diode stack or the top-most p-layer of a p-n-p interband tunnel diode stack, enhancing segregation of the n-type dopant during epitaxial deposition of the p-type film can improve device performance, by effectively sweeping the excess n-type dopants through the p-doped region, thereby preventing their deleterious incorporation.

In an illustrative example, a thin layer of epitaxial growth can be deposited under reduced segregation conditions, such as about 1 to about 3 nanometers, to freeze in as much of the n-type dopants riding atop the growth front as possible and immediately surrounding the desirable n-type degeneracy region. Thereafter, the segregation can be enhanced so as to effectively sweep the n-type dopant past the p-type doping region, and through segregation effects, very few n-type dopants actually become incorporated into regions intended to be doped p-type. Thus, any excess n-type segregating dopants are removed from compensation or dopant pair deep level formation and pushed away from the active tunneling junction.

Further augmentations can be used to improve the integrated RITD performance, such as by strategically inserting thin Ge containing $Si_xGe_{1-x}$ layers, below a critical thickness, immediately cladding the boron (B) delta-doping layers. Since boron is an interstitial diffuser, the lattice strain imparted by the larger diameter Ge atoms, substitutionally replacing Si atoms, can serve to reduce the interstitial vacancies, thereby inhibiting the B from outdiffusing during subsequent thermal processing. As mentioned above, the present inventor also recognizes that the RITDs co-integrated into the hybrid DRAM cell can be tailored for the necessary current density needed by adjusting the effective tunneling distance, nominally set by the distance between the p-type and n-type delta-doping planes.

Figure 16:
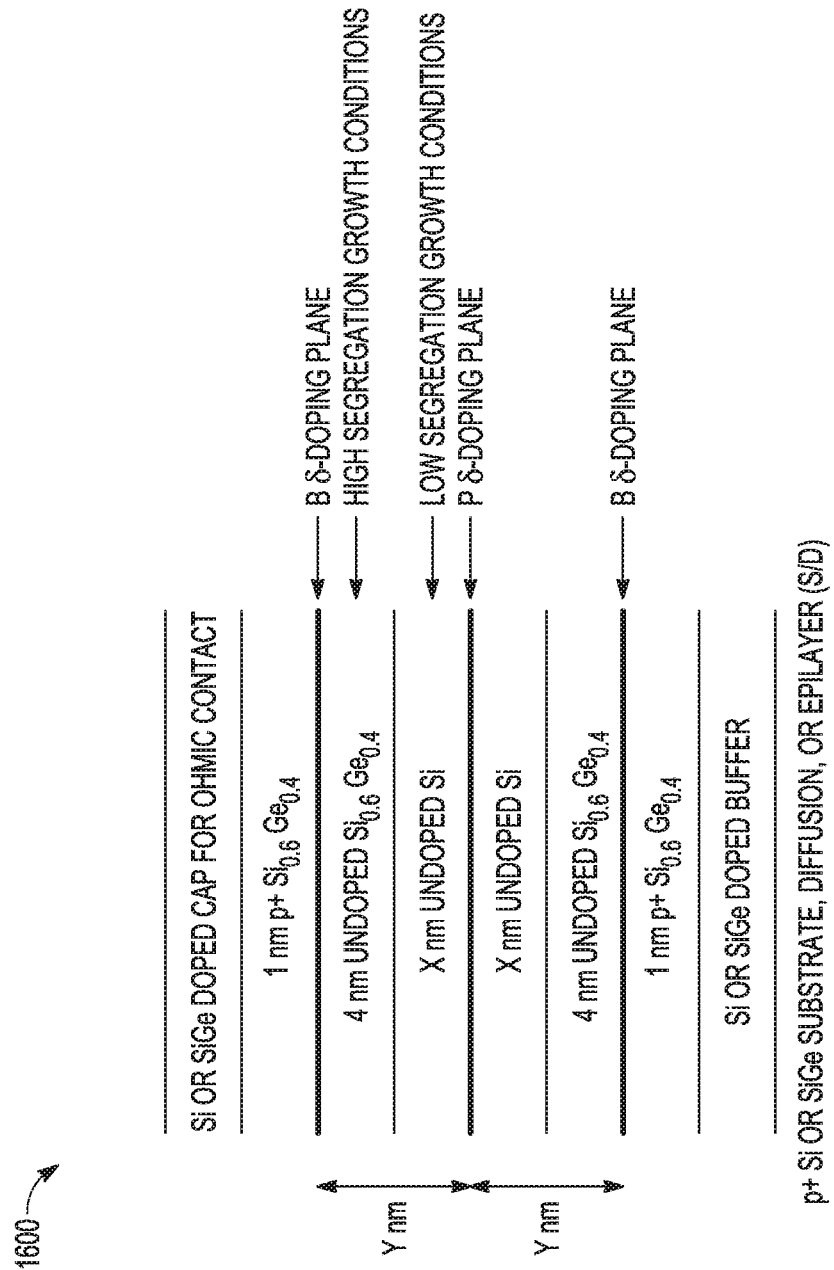
FIG. 16 illustrates generally an illustrative example of a Si/SiGe p-n-p stacked RITD structure including Si/Ge cladding.

FIG. 16 illustrates generally a Si/SiGe p-n-p stacked RITD structure 1600 with Si/Ge cladding. In this illustration, the 1 nm n Silicon layers and the 4 nm $Si_{0.6}Ge_{0.4}$ alloy layers can be regarded as a basic configuration around which further variation can be made, principally to alloy composition and thickness of the 1 nm Si and 4 nm SiGe layers, respectively. For example, tunneling distances denoted by "Y" can then be set by a silicon layer thickness denoted by "X," such as to establish a desired current density.

Figure 17:
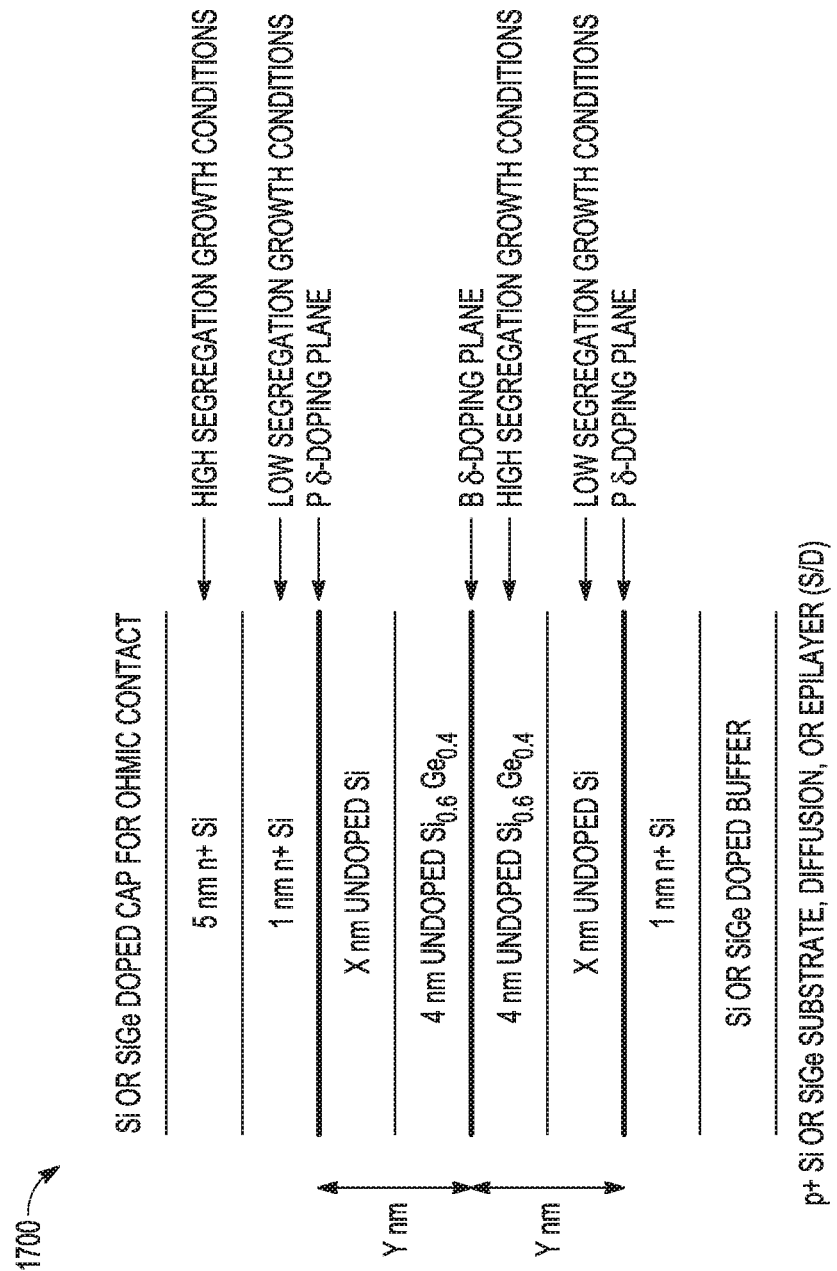
FIG. 17 illustrates generally an illustrative example of a Si/SiGe n-p-n stacked RITD structure including Si/Ge cladding.

FIG. 17 illustrates generally a Si/SiGe n-p-n stacked RITD structure 1700 with Si/Ge cladding. In this illustration, the 1 nm n Silicon layers and the 4 nm $Si_{0.6}Ge_{0.4}$ alloy layers can again be regarded as a basic configuration around which further variation can be made. As in the example of FIG. 16, X can include a value of about 2 nm, or can include a range of values from about 0.5 nm to about 25 nm, or one or more other ranges such as from about 1 nm to about 16 nm.

In an illustrative example including a hybrid memory cell application (such as discussed above), If an underlying base layer (e.g., substrate, diffusion or epilayer in a source or drain region of a transistor) incorporates SiGe, then a percentage of Ge in alloyed regions shown in FIG. 16 or 17 can be raised commensurately.

Other device configurations are possible, such as can include using a wide range of materials. Silicon-based resonant interband tunneling diodes (RITD) generally exhibit a peak tunneling current that can be controlled dominantly by the parameters that define the tunneling spacer of the RITD, set by a tunneling barrier bandgap and a tunneling distance. For delta-doped RITDs, the tunneling distance can be established using a distance between a respective p-type delta-doping quantum well and a respective n-type delta-doping quantum well. Resonant tunneling occurs from the filled states of one quantum well to the empty states of the other polarity quantum well.

An alloy composition of an RITD tunneling barrier can be used to establish a specified bandgap, and a resulting tunneling probability. Current density is exponentially related to an energy barrier height. In an example, a silicon-germanium-carbon-tin alloy can be used. Although the Group IV material system defined by a SiGeCSn alloy system is not completely miscible over the full stoichiometric range, there are quite a number of permutations that are available that provide tailoring of the bandgap as well as strain control. SiGeCSn opens the door to a wide variety of Si-based heterostructure devices commonly reserved for III-V compound semiconductors. For example, SiGe clearly demonstrates improved performance as compared to non-compound or non-alloyed device structures. SiGe technology has become ubiquitous amongst the silicon microelectronics industry. However, SiGe is not lattice-matched to silicon substrates. The silicon diamond lattice must accommodate a larger atomic diameter of Ge atoms and is distorted accordingly, both locally and on long range. Such strain deformation can be used to beneficially modify a transistor channel band structure, thereby reducing the channel carrier effective mass.

By additions of Ge and C in a roughly 8:1 ratio, a SiGeC alloy can maintain Si lattice matching. Similarly, Group IV alloys incorporating the larger atomic diameter of Sn could be compensated by the addition of smaller-diameter C atoms. By adding Sn to the diamond Group IV crystal lattice, the bandgap can be reduced significantly. Further, binary alloys of SiSn and GeSn may lead to quasi-direct bandgap materials that would avoid phonon-mediated band-to-band tunneling expected in generally-available SiGe materials.

Bypassing phonon-mediated tunneling could greatly enhance tunneling probability, allowing direct tunneling, and thereby improve tunnel diode performance, even facilitating tunneling over longer tunneling distances. Unlike Si and Ge, which mix well, the GeC binary system should not occur under equilibrium conditions, and SiC alloys want to precipitate out as a carbide. Carbon, which has a much smaller lattice constant and atomic radius is difficult to get incorporated into the crystal lattice substitutionally. Much of the carbon enters the lattice interstitially.

Without being bound by theory, Brillioun Zone folding by growing short period superlattices could convert the SiGeC indirect bandgap to a quasi-direct bandgap. A new binary superlattice can be viewed as a new crystal with a different Bravais lattice. Within the material, a new energy state is created at the zone center by which efficient optical transitions can occur. Also, by tailoring the ternary alloy or buffer composition, strain can be independently controlled about the lattice matching condition for Si substrates. Strain can act to modify the band structure as well.

The present inventor has recognized that adding certain alloy compositions surrounding the p-type and n-type delta-doping layers contributes to effectively cladding the delta-doping and suppressing dopant outdiffusion, such as in the illustrative example of using SiGe around p-type doping domains. The level of degeneracy and the density of states inside the n-type and p-type quantum wells also controls the quantum tunneling efficiency of RITDs. Larger quantum well carrier density and density-of-states both aide in RITD tunneling probability and performance leading to higher peak-to-valley current ratios and peak current densities.

The present inventor has also recognized that C-doping can be strategically applied to suppress p-type dopant out-diffusion, particularly in relation to boron-doped regions, for example. In an example, without being bound by theory, directly adding C doping within the vicinity of the p-type delta-doping spike can lead to solution hardening and inhibit the interstitial mediated diffusion common to B doping, and independent of Group IV alloy composition and bandgap tailoring, mentioned previously. Thus, a p-type delta-doping spike in a specified region (e.g., an injector layer or confinement region) can be retained and can be more tolerant of subsequent high temperature processing as well as extending tunnel diode device lifetime and lowering device dependency upon ambient temperature.

Figure 18:
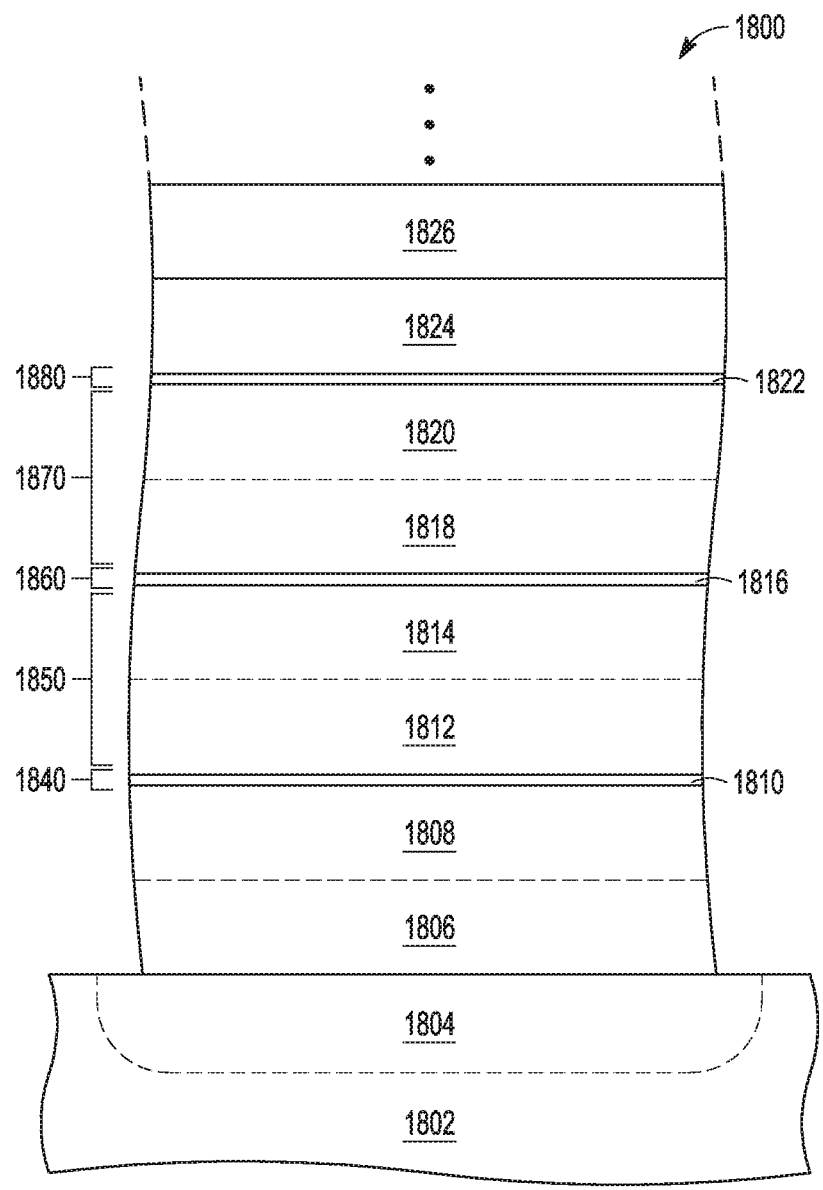
FIG. 18 illustrates generally an illustrative example of a generalized device configuration.

FIG. 18 illustrates generally an illustrative example of a generalized device 1800 configuration, such as can be fabricated upon a region 1802 such as substrate, an epitaxial layer, or upon a portion of another integrated device structure such as a transistor. For example, the region 1802 can include a diffusion or well region 1804. A first buffer layer 1806 can include a semiconductor material such as silicon, a compound semiconductor, or an alloy such as a silicon-germanium alloy or other combination of materials. Such a buffer layer 1806 can provide a buffer between a first semiconductor layer 1808 having a first conductivity type opposite a second conductivity type of the region 1802 or well region 1804. A first quantum well 1840 can be formed such as by establishing a first delta-doped region 1810 upon or within the first semiconductor layer 1808. The first delta-doped region 1810 can share a first conductivity type with the first semiconductor layer, but can be doped to a much higher concentration, such as to meet a degeneracy criterion, such as to provide a first "injector" layer. A spacer 1850 can be formed such as using one or more regions formed upon the delta-doped region 1810, such as to establish a tunneling barrier. For example, the first spacer 1850 can include an insulator or a semiconductor material, such as an intrinsic semiconductor, a compound semiconductor, or an alloy. The first spacer 1850 can include various layers having different materials or different doping concentrations, such as to provide a "composite" spacer.

A first portion 1812 of the first spacer 1850 can include an undoped intrinsic semiconductor such as silicon, such as in an illustrative example wherein the first conductivity type is n-type (e.g., where phosphorus is used as a dopant) in the first delta-doped region 1810. In this illustrative example, a second portion 1814 of the first spacer 1850 can include a semiconductor alloy, such as an alloy of silicon and germanium to provide a first "cladding" layer adjacent to a second delta-doped region 1816. The second delta-doped region 1816 can have a second conductivity type opposite the first delta-doped region 1810, such as a p-type region that can include boron doping at a concentration meeting a degeneracy criterion. The second delta-doped region 1816 can provide a second "injector."

A second spacer 1870 can be used to establish a second tunneling barrier. Similar to the first spacer 1850, the second spacer 1870 can include one or more layers that can include an insulator or a semiconductor material. In an example where the second delta-doped region 1816 includes a p-type conductivity (e.g., using boron), a second portion 1818 of the second spacer 1870 can include a silicon-germanium alloy such as to provide a second "cladding" region around the second delta-doped region 1816. Other materials or alloys can be used for such "cladding" regions, such as a SiGeCSn alloy, as discussed elsewhere herein.

A first portion 1820 of the second spacer 1870 can include an intrinsic semiconductor or insulator, such as in an illustrative example where a third delta-doped region 1822 includes the first conductivity type (e.g., an n-type conductivity). The third delta-doped region 1822 can establish a third quantum well 1880, such as to provide a third "injector" layer. A thickness of the first spacer 1850 can be used at least in part to control a probability of carriers tunneling from the first quantum well 1840 to the second quantum well 1860, and a thickness of the second spacer 1870 can be used at least in part to control a probability of carriers tunneling from the second quantum well 1860 to the third quantum well 1880. One or more layers can be formed on a face of the third delta-doped region 1822 opposite the second spacer 1870. For example, one or more layers such as a second semiconductor layer 1824 or a third semiconductor layer 1826 can be formed on the face of the third delta-doped region 1822 opposite the second spacer 1870.

As discussed elsewhere herein, processing under "low" or "high" segregation conditions can be used, such as to provide or maintain a desired doping concentration within one or more of the first, second, and third delta-doped regions 1810, 1816, and 1822. In an illustrative example where the first delta-doped region 1810 includes an n-type conductivity, a low segregation processing condition can be used for the first portion 1812 of the spacer 1850. A high segregation processing condition can be used for formation of one or more of the second portion 1814 of the first spacer 1850. Similarly, where the third delta-doped region 1822 includes an n-type conductivity and where the second semiconductor layer 1824 includes an n-type conductivity, a low segregation processing condition can used during formation of the second semiconductor layer 1824. A high segregation processing condition can be used during formation of a third semiconductor layer 1826, also including an n-type conductivity. In this manner, an n-p-n interband tunneling device stack can be formed, such as to provide a symmetric negative differential resistance around a zero-bias condition (see, e.g., FIG. 17).

In another illustrative example, the first conductivity type can instead be a p-type conductivity (e.g., the first delta-doping region 1810 and the third delta-doped region 1822 can include p-type conductivity). The second delta-doped region 1816 can include n-type conductivity. The first and second portions of each of the spacers 1850 and 1870 can be swapped, for example, so that in this example the semiconductor alloy regions of the spacers 1850 and 1870 are located in contact with the first delta-doped region 1810 (as in the case of the spacer 1850) and with the second delta-doped region 1822 (as in the case of the spacer 1870), respectively, to provide cladding of the p-type delta-doped regions 1810 and 1822. In this illustrative example, the first semiconductor layer 1808 can also include a semiconductor alloy, such as doped to provide a conductivity type (e.g., p-type) matching the first delta-doped region 1810, but at weak concentration in comparison to the degenerate delta-doped "spike" of the delta-doped region 1810. Similarly, in this example, the second semiconductor layer 1824 can include a semiconductor alloy doped to provide a conductivity type (e.g., p-type) matching the third delta-doped region 1822. The locations where low and high segregation conditions can be used for the forming the layers of the spacers 1850 and 1870 can be similarly swapped for this example and in this manner a p-n-p interband tunneling device can be formed (see, e.g., FIG. 16). The second or third semiconductor layers 1824 or 1826 can provide an offset between a top contact and a top injector (e.g., the third delta-doped region 1822).

Figure 19:
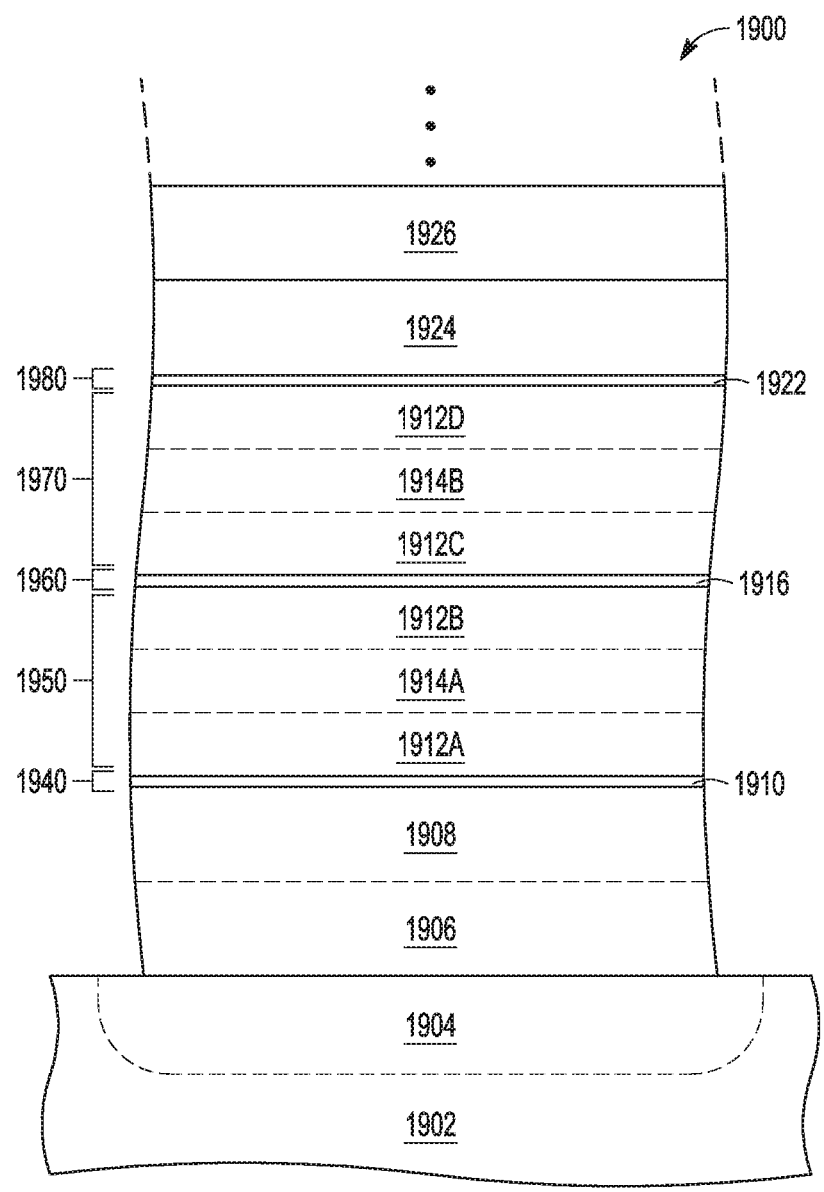
FIG. 19 illustrates generally an illustrative example of another generalized device configuration.

The spacers 1850 and 1870 need not include exactly one or two layers. For example, FIG. 19 illustrates generally an illustrative example of a generalized device 1900 configuration, such as can be fabricated upon a substrate, an epitaxial layer, or upon a portion of another integrated device structure such as a transistor. In the example of FIG. 19, one or more confinement layers can be separated from adjacent confinement layers in a device stack such as using a "composite" barrier including three or more layers. For example, a substrate region 1902 can include a well region 1904 (or the other layers can be formed directly upon the substrate region 1902).

The device 1900 can include a first conductivity type layer 1908, and a first confinement layer 1940 (e.g., a first delta-doped region 1910). A buffer layer 1906 can be included between the first conductivity type layer 1908 and the substrate 1902. A first tunneling barrier 1950 can be formed between the first confinement layer 1940 and a second confinement layer 1960 (e.g., a second delta-doped region 1916). The second confinement layer 1960 can have a second conductivity type opposite the first confinement layer 1940. A second tunneling barrier 1970 can be formed next to the second confinement layer 1960 to separate the second confinement layer 1960 from a third confinement layer 1980. The third confinement layer 1980 can include the first conductivity type.

The tunnel barriers 1950 and 1970 can include multiple layers. For example, the first spacer can include first and second low-doped spacer layers 1912A and 1912B. A first tunneling layer 1914A can be formed between the first and second low-doped spacer layers 1912A and 1912C. Similarly, a second tunneling layer 1914B can be located between third and further low-doped spacer layers 1912C and 1912D. In an example, at least one of the layers included in the first or second tunneling barriers 1950 and 1970 can include an intrinsic semiconductor material. Other materials can be included in one or more of the layers comprising the first and second tunneling barriers 1950 and 1970, such as an insulator, a compound semiconductor, or a semiconductor alloy.

Figure 20:
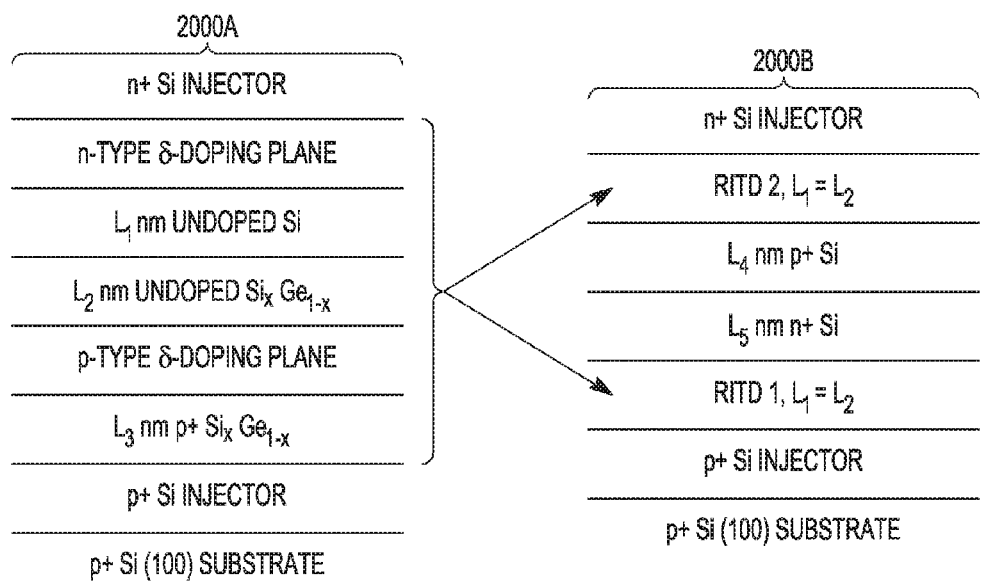
FIG. 20 illustrates generally an example of a generic Si-based RITD design, and a corresponding vertically stacked RITD pair using an npnp configuration of two generic Si-based RITDs connected serially by a backwards diode to generate a double NDR region.

FIG. 20 illustrates generally an example of a generic Si-based RITD configuration 2000A, and a corresponding vertically stacked configuration 2000B including an RITD pair, such as can be included as a portion of a multi-state memory circuit providing multiple "humps" in a corresponding current-voltage response.

In the configuration 2000A, an n+ injector layer can be provided nearby an n-type delta-doping plane (e.g., such as can be doped using phosphorus). Undoped Si and $Si_xGe_{1-x}$ layers having thicknesses $L_1$ and $L_2$ can be provided, such as between the n-type delta-doping plane and a p-type delta-doping plane (such as can be doped using boron). A cladding layer can be provided adjacent to the p-type delta-doping layer, such as can include a $Si_xGe_{1-x}$ layer having thickness $L_3$. A p+ injector layer can be provided between the lower $Si_xGe_{1-x}$ layer and the substrate.

In the stacked configuration 2000B, the RITD pair can provide an npnp configuration of two generic Si-based RITDs (e.g., each including delta-doping and cladding as shown in the bracketed region of the configuration 2000A) connected serially by a backwards diode (e.g., including n+ and p+ layers having thicknesses $L_4$ and $L_5$ respectively) to generate a double NDR region. In this manner, the structure 2000B shown in FIG. 20 can provide three states. Further RITDs can be included in the stacked configuration 2000B, such as coupled serially through additional diode structures similar to the $L_4/L_5$ layer pair, such as to provide additional "humps" in the corresponding current-voltage characteristic, enabling additional states such as four, five, six, seven, or even more states. Such current-voltage relationships are illustrated generally in FIGS. 8D and 8E as illustrative examples (e.g., a three RITD driver structure can provide a current-voltage response similar to FIG. 8D and a seven RITD driver structure can provide a current-voltage response similar to FIG. 8E). The present inventor has recognized, among other things, that a configuration 2000B, such as shown in FIG. 20, can be coupled to an external capacitor (e.g., an integrated capacitor other than a parasitic capacitor provided by one or more tunnel diode structures), such as to provide a robust multi-state memory without requiring refresh.

Various Examples Including Device Structures and Fabrication Techniques

Example 1 can include or use subject matter (such as an apparatus, a method, a means for performing acts, or a device readable medium including instructions that, when performed by the device, can cause the device to perform acts), such as can include or use an electronic device, comprising an integrated circuit including an integrated transistor, an integrated capacitor coupled to the integrated transistor, a pair of devices each exhibiting symmetric negative differential resistance, where the integrated transistor, the integrated capacitor, and the device pair are arranged to provide a memory cell, the memory cell configured to store a bit value at least in part using a capacitance provided by a portion of the pair of devices exhibiting symmetric negative differential resistance.

Example 2 can include, or can optionally be combined with the subject matter of Example 1, to optionally include each negative differential resistance device comprising a pair of back to back interband tunnel diodes serially connected by a junction configuration providing a low resistance backward diode biased under Zener breakdown.

Example 3 can include, or can optionally be combined with the subject matter of one or any combination of Examples 1 or 2 to optionally include at least one of the pair of devices comprising a pair of interband tunnel diodes.

Example 4 can include or use subject matter (such as an apparatus, a method, a means for performing acts, or a device readable medium including instructions that, when performed by the device, can cause the device to perform acts), such as can include or use an electronic device, comprising an integrated circuit including an integrated transistor, an integrated capacitor coupled to the integrated transistor, and a first tunnel diode, where the integrated transistor, the integrated capacitor, and the tunnel diode are arranged to provide a memory cell, the memory cell configured to store a bit value at least in part using a capacitance provided by the tunnel diode.

Example 5 can include, or can optionally be combined with the subject matter of Example 4, to optionally include a dissipative load device electrically coupled to a sensing node, where a terminal of the integrated capacitor and a terminal of the first tunnel diode are electrically coupled to the sensing node.

Example 6 can include, or can optionally be combined with the subject matter of one or any combination of Examples 4 or 5 to optionally include a second integrated transistor electrically coupled to a sensing node, where a terminal of the integrated capacitor and a terminal of the first tunnel diode are electrically coupled to the sensing node.

Example 7 can include, or can optionally be combined with the subject matter of one or any combination of Examples 4 through 6 to optionally include a second tunnel diode electrically coupled to a sensing node, the second tunnel diode located between the sensing node and a first power supply node, where a first terminal of the integrated capacitor and a first terminal of the first tunnel diode are electrically coupled to the sensing node, and where a second terminal of the integrated capacitor and a second terminal of the first tunnel diode are electrically coupled to a second power supply node.

Example 8 can include or use subject matter (such as an apparatus, a method, a means for performing acts, or a device readable medium including instructions that, when performed by the device, can cause the device to perform acts), such as can include or use an electronic device, comprising an integrated circuit including an integrated transistor, an integrated capacitor coupled to the integrated transistor, and a tunnel diode pair, where the integrated transistor, the integrated capacitor, and the tunnel diode pair are arranged to provide a memory cell, the memory cell configured to store a bit value at least in part using a capacitance provided by a tunnel diode included in the tunnel diode pair.

Example 9 can include, or can optionally be combined with the subject matter of Example 8, to optionally include an integrated capacitor and tunnel diode pair configured to establish a random access memory cell where the tunnel diode pair is configured to provide a self-restoring current to retain a written bit value state without requiring a refresh.

Example 10 can include, or can optionally be combined with the subject matter of one or any combination of Examples 8 or 9 to optionally include an integrated capacitor and at least one tunnel diode connected in parallel.

Example 11 can include, or can optionally be combined with the subject matter of Example 10, to optionally include at least one tunnel diode connected in parallel with the integrated capacitor configured as a driver structure of the memory cell.

Example 12 can include, or can optionally be combined with the subject matter of one or any combination of Examples 8 through 11 to optionally include at least one tunnel diode is arranged in a stacked configuration directly upon at least a portion of the transistor.

Example 13 can include, or can optionally be combined with the subject matter of one or any combination of Examples 8 through 12 to optionally include at least one tunnel diode arranged in a stacked configuration located directly upon a source or drain region of the transistor.

Example 14 can include, or can optionally be combined with the subject matter of one or any combination of Examples 12 or 13 to optionally include a transistor comprising a three-dimensional transistor, where the stacked configuration is located upon at least a portion of the three-dimensional transistor.

Example 15 can include, or can optionally be combined with the subject matter of one or any combination of Examples 8 through 14 to optionally include at least one tunnel diode arranged in a stacked configuration stacked configuration conformally wraps around at least a portion of a three dimensional transistor and is located in contact with a source or drain region of the transistor.

Example 16 can include, or can optionally be combined with the subject matter of one or any combination of Examples 8 through 15 to optionally include an integrated circuit comprises a silicon substrate.

Example 17 can include, or can optionally be combined with the subject matter of one or any combination of Examples 8 through 16 to optionally include at least one tunnel diode comprising at least one interband tunneling diode (ITD).

Example 18 can include, or can optionally be combined with the subject matter of Example 17, to optionally include an ITD comprising a resonant interband tunnel diode comprising a heterojunction.

Example 19 can include, or can optionally be combined with the subject matter of Example 18, to optionally include and ITD comprising a resonant interband tunnel diode comprising a Si/SiGe heterojunction.

Example 20 can include, or can optionally be combined with the subject matter of one or any combination of Examples 17 through 19 to optionally include a RITD including a delta-doping profile.

Example 21 can include, or can optionally be combined with the subject matter of one or any combination of Examples 17 through 20 to optionally include an interband tunneling diode comprising a silicon-based RITD including a p-type delta doping of acceptors, an n-type delta doping of donors, a tunneling barrier located between the p-type and n-type delta doping layers, where a portion of the tunneling barrier comprises an alloy layer including at least two of silicon, germanium, carbon, and tin.

Example 22 can include, or can optionally be combined with the subject matter of one or any combination of Examples 17 through 20 to optionally include an interband tunneling diode comprises a silicon-based RITD including a p-type delta doping of acceptors, an n-type delta doping of donors located on a first side of the p-type delta doping, a barrier comprising a first alloy layer including at least two of silicon, germanium, carbon, and tin located on a first side of the p-type delta doping at least in part separating the p-type delta doping from the n-type delta doping, and an interposed second alloy layer including at least two of silicon, germanium, carbon, and tin adjacent the barrier first alloy layer and the p-type delta doping, the interposed second alloy layer and the barrier first alloy layer defining a unitary layer substantially containing the p-type delta doping.

Example 23 can include, or can optionally be combined with the subject matter of Example 22 to optionally include a first alloy layer including a first mole fractions of constituents, and a second alloy layer including a different second mole fractions of constituents.

Example 24 can include, or can optionally be combined with the subject matter of one or any combination of Examples 20 through 23 to optionally include an interband tunneling diode including a silicon-based RITD including carbon doping around a boron-doped delta-doping layer.

Example 25 can include, or can optionally be combined with the subject matter of one or any combination of Examples 8 through 24 to optionally include back-to-back interband tunnel diodes connected via a low resistance backward diode junction.

Example 26 can include, or can optionally be combined with the subject matter of Example 25 to optionally include a low resistance backward diode junction comprising a delta-doping profile.

Example 27 can include, or can optionally be combined with the subject matter of one or any combination of Examples 8 through 26 to optionally include a capacitor comprising a trench capacitor.

Example 28 can include, or can optionally be combined with the subject matter of one or any combination of Examples 8 through 27 to optionally include a capacitor comprising a stacked capacitor.

Example 29 can include, or can optionally be combined with the subject matter of one or any combination of Examples 8 through 28 to optionally include at least one tunnel diode included in the tunnel diode pair including a symmetric tunnel diode structure comprising back-to-back interband tunnel diodes to provide symmetric current-voltage characteristics around a zero bias point.

Example 30 can include, or can optionally be combined with the subject matter of one or any combination of Examples 8 through 29 to optionally include two additional transistors arranged in a gain cell configuration to provide gain cell enhancement to the memory cell.

Example 31 can include subject matter (such as an apparatus, a method, a means for performing acts, or a machine readable medium including instructions that, when performed by the machine, that can cause the machine to perform acts), such as can include a method of fabricating an interband tunneling diode for use in any of the structures described herein, the method comprising forming a first conductivity type layer on a substrate, forming a first confinement layer next to the first conductivity type layer, forming a tunneling layer next to the first confinement layer, forming a second confinement layer next to the tunneling layer, and forming an opposite second conductivity type layer next to the second confinement layer.

Example 32 can include, or can optionally be combined with the subject matter of Example 31, to optionally include a first conductivity type that is p-type, and where an opposite second conductivity type is n-type.

Example 33 can include, or can optionally be combined with the subject matter of Example 31, to optionally include a first conductivity type that is n-type, and where an opposite second conductivity type is p-type.

Example 34 can include, or can optionally be combined with the subject matter of one or any combination of Examples 31 through 33 to optionally include first and second confinement layers, and the tunneling layer are grown epitaxially.

Example 35 can include, or can optionally be combined with the subject matter of one or any combination of Examples 31 through 34 to optionally include that the first confinement layer, the second confinement layer, and the tunneling layer are grown at a rate from about 0.001-10 nm/s.

Example 36 can include, or can optionally be combined with the subject matter of one or any combination of Examples 31 through 34 to optionally include that the first confinement layer, the second confinement layer, and the tunneling layer are grown at a rate of 0.01-1 nm/s.

Example 37 can include, or can optionally be combined with the subject matter of one or any combination of Examples 31 through 34 to optionally include that the first confinement layer, the second confinement layer, and the tunneling layer are grown at a rate of 0.05-0.2 nm/s.

Example 38 can include, or can optionally be combined with the subject matter of one or any combination of Examples 31 through 34 to optionally include that the first and second confinement layers, and the tunneling layer are grown in a molecular beam epitaxial (MBE) growth system.

Example 39 can include, or can optionally be combined with the subject matter of Example 38, to optionally include that the molecular beam epitaxial (MBE) growth system is maintained at a pressure of $1\times10^{-6}$ and $1\times10^{-11}$ Pa during growth.

Example 40 can include, or can optionally be combined with the subject matter of one or any combination of Examples 38 or 39 to optionally include that molecular beam epitaxial (MBE) growth system maintains a substrate temperature between 50° C. and 900° C. during growth of the epitaxial layers.

Example 41 can include, or can optionally be combined with the subject matter of one or any combination of Examples 31 through 33 to optionally include that the first and second confinement layers, and the tunneling layer are grown using chemical vapor deposition (CVD).

Example 42 can include, or can optionally be combined with the subject matter of one or any combination of Examples 31 through 41 to optionally include heat treating the interband tunneling diode during or after growth of the first and second confinement layers, and the tunneling layer.

Example 43 can include, or can optionally be combined with the subject matter of one or any combination of Examples 31 through 42 to optionally include lowering a substrate temperature before or during growth of the first and second confinement layers, and the tunneling layer.

Example 44 can include subject matter (such as an apparatus, a method, a means for performing acts, or a machine readable medium including instructions that, when performed by the machine, that can cause the machine to perform acts), such as can include a method of fabricating an interband tunneling diode for use in any of the structures described herein, the method comprising forming a first conductivity type layer on a substrate, forming a first confinement layer next to the first conductivity type layer, forming a first low doped spacer layer next to the first confinement layer, forming a tunneling layer next to the first low doped spacer layer, forming a second low doped spacer layer next to the tunneling layer, forming a second confinement layer next to the second low doped spacer layer, and forming an opposite second conductivity type layer next to the second confinement layer.

Example 45 can include, or can optionally be combined with the subject matter of Example 44, to optionally include a first conductivity type that is p-type, and where an opposite second conductivity type is n-type.

Example 46 can include, or can optionally be combined with the subject matter of Example 44, to optionally include a first conductivity type that is n-type, and where an opposite second conductivity type is p-type.

Example 47 can include, or can optionally be combined with the subject matter of one or any combination of Examples 44 through 46 to optionally include heat treating the interband tunneling diode during or after growth of the first and second confinement layers, the first and second low doped spacer layers, and the tunneling layer.

Example 48 can include, or can optionally be combined with the subject matter of one or any combination of Examples 44 through 47 to optionally include that the first and second confinement layers, the first and second low doped spacer layers and the tunneling layer are grown epitaxially.

Example 49 can include, or can optionally be combined with the subject matter of Example 48, to optionally include that the first confinement and second confinement layers, the first and second low doped spacer layers and the tunneling layer are grown at a rate of 0.001-10 nm/s.

Example 50 can include, or can optionally be combined with the subject matter of Example 48, to optionally include that the first confinement and second confinement layers, the first and second low doped spacer layers and the tunneling layer are grown at a rate of 0.01-1 nm/s.

Example 51 can include, or can optionally be combined with the subject matter of Example 48, to optionally include that the first confinement and second confinement layers, the first and second low doped spacer layers and the tunneling layer are grown at a rate of 0.05-0.2 nm/s.

Example 52 can include, or can optionally be combined with the subject matter of one or any combination of Examples 48 through 51 to optionally include that the first and second confinement layers, the first and second low doped spacer layers, and the tunneling layer are grown in a molecular beam epitaxial (MBE) growth system.

Example 53 can include, or can optionally be combined with the subject matter of Example 51, to optionally include that the molecular beam epitaxial (MBE) growth system is maintained at a pressure of $1\times10^{-6}$ and $1\times10^{-11}$ Pa during growth.

Example 54 can include, or can optionally be combined with the subject matter of one or any combination of Examples 52 or 53 to optionally include that the molecular beam epitaxial (MBE) growth system maintains a substrate temperature between 50° C. and 900° C. during growth of the epitaxial layers.

Example 55 can include, or can optionally be combined with the subject matter of one or any combination of Examples 44 through 47 to optionally include that the first and second confinement layers, the first and second low doped spacer layers, and the tunneling layer are grown using chemical vapor deposition (CVD).

Example 56 can include, or can optionally be combined with the subject matter of one or any combination of Examples 44 through 48 to optionally include, during or after growth of the tunneling layers of the diode, annealing the diode using an inert or reducing gas ambient at a temperature in the range of 300° C. to 1000° C.

Example 57 can include, or can optionally be combined with the subject matter of one or any combination of Examples 44 through 48 to optionally include, during or after growth of the tunneling layers of the diode, annealing the diode using an inert or reducing gas ambient at a temperature in the range of 500° C. to 900° C.

Example 58 can include, or can optionally be combined with the subject matter of one or any combination of Examples 44 through 48 to optionally include heat treating the diode during or after the growth of the tunneling layers of the diode.

Example 59 can include, or can optionally be combined with the subject matter of one or any combination of Examples 44 through 48 to optionally include annealing the diode using an inert or reducing gas ambient.

Example 60 can include, or can optionally be combined with the subject matter of one or any combination of Examples 44 through 48 to optionally include annealing the diode at a temperature in the range of 300° C. to 1000° C.

Example 61 can include, or can optionally be combined with the subject matter of one or any combination of Examples 44 through 48 to optionally include annealing the diode at a temperature in the range of 450° C. to 900° C.

Example 62 can include, or can optionally be combined with the subject matter of one or any combination of Examples 44 through 48 to optionally include annealing the diode at a temperature in the range of 600° C. to 800° C.

Example 63 can include, or can optionally be combined with the subject matter of one or any combination of Examples 44 through 48 to optionally include annealing the diode for up to 6 hours.

Example 64 can include, or can optionally be combined with the subject matter of one or any combination of Examples 44 through 48 to optionally include the diode for up to 1 hour.

Example 65 can include, or can optionally be combined with the subject matter of one or any combination of Examples 44 through 48 to optionally include the diode for up to 10 minutes.

Example 66 can include, or can optionally be combined with the subject matter of one or any combination of Examples 44 through 48 to optionally include annealing the diode for up to 2 minutes.

Example 67 can include subject matter (such as an apparatus, a method, a means for performing acts, or a machine readable medium including instructions that, when performed by the machine, that can cause the machine to perform acts), such as can include a method of fabricating an interband tunneling diode comprising growing a p-type injector and an n-type injector epitaxially at reduced substrate temperature.

Example 68 can include, or can optionally be combined with the subject matter of Example 67, to optionally include growing the p-type injector and n-type injector while maintaining a substrate temperature between 0° C. and 900° C.

Example 69 can include, or can optionally be combined with the subject matter of Example 68, to optionally include growing the p-type injector and n-type injector while maintaining a substrate temperature between 20° C. and 450° C.

Example 70 can include or use subject matter (such as an apparatus, a method, a means for performing acts, or a device readable medium including instructions that, when performed by the device, can cause the device to perform acts), such as can include or use a symmetric interband tunnel diode device, comprising a bottom injector layer separated by an offset from a bottom contact, a middle injector layer, a bottom spacer located between the bottom injector and middle injector layers configured to establish a first tunnel barrier, a top injector layer separated by an offset from a top contact, a top spacer located between the top injector and middle injector layers configured to establish a second tunnel barrier, where the bottom injector, middle injector, and top injector layers form the ends of one of a p-i1-n-i2-p structure or an n-i1-p-i2-n structure, where an it region of the p-i1-n-i2-p structure or the n-i1-p-i2-n structure includes at least one intrinsic semiconductor material located between the bottom and middle injectors, and where an i2 region in the p-i1-n-i2-p structure or the n-i1-p-i2-n structure includes at least one intrinsic semiconductor material provided between the middle and top injectors.

Example 71 can include, or can optionally be combined with the subject matter of Example 70, to optionally include a first quantum well established in contact with the bottom injector layer and in contact with, or separated by an offset from, the first tunnel barrier, a second quantum well established in contact with the middle injector layer and is also in contact with, or separated by an offset from, the first and second tunnel barriers, and a third quantum well established in contact with the top injector layer and is also in contact with, or separated by an offset from, the second tunnel barrier.

Example 72 can include, or can optionally be combined with the subject matter of Example 71, to optionally include that at least one of the first, second, and third quantum wells comprises establishing an energy band offset at, or near, a heterojunction.

Example 73 can include, or can optionally be combined with the subject matter of one or any combination of Examples 71 or 72 to optionally include that the quantum wells each comprise a highly-doped layer.

Example 74 can include, or can optionally be combined with the subject matter of one or any combination of Examples 71 through 73 to optionally include that the quantum wells each include a delta doped layer.

Example 75 can include, or can optionally be combined with the subject matter of one or any combination of Examples 71 through 74 to optionally include that the quantum wells are each doped above a concentration of $10^{12}$ cm$^{-2}$.

Example 76 can include, or can optionally be combined with the subject matter of one or any combination of Examples 71 through 74 to optionally include that the quantum wells are each doped above a concentration of $10^{13}$ cm$^{-2}$.

Example 77 can include, or can optionally be combined with the subject matter of one or any combination of Examples 71 through 76 to optionally include that the quantum wells are each less than or equal to 10 nm thick.

Example 78 can include, or can optionally be combined with the subject matter of one or any combination of Examples 71 through 76 to optionally include that the quantum wells are each less than or equal to 2.5 nm thick.

Example 79 can include, or can optionally be combined with the subject matter of one or any combination of Examples 71 through 78 to optionally include that the quantum wells are configured to establish resonant tunneling between a respective quantum well having a first polarity and an opposite polarity injector layer.

Example 80 can include, or can optionally be combined with the subject matter of one or any combination of Examples 71 through 79 to optionally include that one or more of the bottom injector layer, the middle injector layer, the top injector layer, the bottom spacer, or the top spacer include one or more of a semiconductor material or an insulator.

Example 81 can include, or can optionally be combined with the subject matter of one or any combination of Examples 71 through 80 to optionally include that one or more the bottom injector layer, the middle injector layer, the top injector layer, the bottom spacer, or the top spacer include a material compatible with silicon.

Example 82 can include, or can optionally be combined with the subject matter of one or any combination of Examples 71 through 80 to optionally include that one or more the bottom injector layer, the middle injector layer, the top injector layer, the bottom spacer, or the top spacer include a Group IV alloy.

Example 83 can include, or can optionally be combined with the subject matter of one or any combination of Examples 71 through 80 to optionally include that one or more the bottom injector layer, the middle injector layer, the top injector layer, the bottom spacer, or the top spacer include a species selected from the list comprising Si, Ge, C, Sn, $Si_{1-x}C_x$, $Si_{1-x}Sn_x$, $Si_{1-x-y}Ge_xC_y$, $Si_{1-x-y}Ge_xC_ySn_z$, $Si_{1-x}O_x$, $Si_{1-x}N_x$, $Al_{1-x}O_x$, and combinations thereof.

Example 84 can include, or can optionally be combined with the subject matter of one or any combination of Examples 71 through 83 to optionally include that at least one of the first spacer or the second spacer comprises a tunnel barrier material doped below a concentration of $10^{17}$ cm$^{-3}$.

Example 85 can include, or can optionally be combined with the subject matter of one or any combination of Examples 71 through 84 to optionally include that the tunnel barrier material is less than or equal to 50 nm thick.

Example 86 can include, or can optionally be combined with the subject matter of one or any combination of Examples 71 through 85 to optionally include that the tunnel barrier material is less than or equal to 10 nm thick.

Example 87 can include or use subject matter (such as an apparatus, a method, a means for performing acts, or a device readable medium including instructions that, when performed by the device, can cause the device to perform acts), such as can include a method of fabricating a symmetric interband tunneling diode device for use in any of the structures described herein, the method comprising forming a first conductivity type layer on a substrate, forming a first confinement layer next to the first conductivity type layer, forming a first low-doped tunneling spacer layer next to the first confinement layer on a side opposite the first conductivity type layer, forming a first low-doped tunneling layer next to the first low doped tunneling spacer layer on a side opposite the first confinement layer, forming a second low-doped tunneling spacer layer next to the first-low doped tunneling layer on a side opposite the first low-doped tunneling spacer layer, forming a second confinement layer next to the second low-doped tunneling spacer layer on a side opposite the first low-doped tunneling layer, forming a third low-doped tunneling spacer layer next to the second confinement layer on a side opposite the second low-doped tunneling spacer layer, forming a third low-doped tunneling layer next to the third low-doped tunneling spacer layer on a side opposite the second confinement layer, forming a third confinement layer next to the third low-doped tunneling layer, and forming a second conductivity type layer next to the third confinement layer.

Example 88 can include, or can optionally be combined with the subject matter of Example 87, to optionally include that the confinement layers are each fabricated by establishing an energy band offset at, or near, a heterojunction.

Example 89 can include, or can optionally be combined with the subject matter of one or any combination of Examples 87 or 88 to optionally that the confinement layers are each fabricated by forming a highly doped layer.

Example 90 can include, or can optionally be combined with the subject matter of one or any combination of Examples 87 through 89 to optionally include that the confinement layers are each fabricated to include a delta-doped layer.

Example 91 can include, or can optionally be combined with the subject matter of one or any combination of Examples 87 through 90 to optionally include that the third low-doped tunneling spacer layer next to the second confinement layer is grown under low segregation conditions.

Example 92 can include, or can optionally be combined with the subject matter of one or any combination of Examples 87 through 91 to optionally include that the second low-doped tunneling layer next to the third low-doped tunneling spacer layer is grown under high segregation conditions.

Example 93 can include, or can optionally be combined with the subject matter of one or any combination of Examples 87 through 92 to optionally include that the first low-doped tunneling spacer layer next to the first confinement layer is grown under low segregation conditions.

Example 94 can include, or can optionally be combined with the subject matter of one or any combination of Examples 87 through 93 to optionally include that the first low-doped tunneling layer next to the first low-doped tunneling spacer layer is grown under high segregation conditions.

Example 95 can include, or can optionally be combined with the subject matter of one or any combination of Examples 87 through 94 to optionally include that the second conductivity type layer next to the third confinement layer is first grown under low segregation conditions followed by high segregation conditions.

Example 96 can include, or can optionally be combined with the subject matter of one or any combination of Examples 87 through 95 to optionally include that respective layers are grown by molecular beam epitaxy.

Example 97 can include, or can optionally be combined with the subject matter of one or any combination of Examples 88 through 96 to optionally include that the devices are grown by chemical vapor deposition.

Example 98 can include, or can optionally be combined with the subject matter of one or any combination of Examples 91, 93, 95, or 96 to optionally include that the low segregation conditions include reduced substrate temperature.

Example 99 can include, or can optionally be combined with the subject matter of one or any combination of Examples 91, 93, 95, 96, or 98 to optionally include that the low segregation conditions include a reduced substrate temperature, the temperature reduced by more than 100 degrees Celsius as compared to a temperature used for processing other active device layers.

Example 100 can include, or can optionally be combined with the subject matter of one or any combination of Examples 91, 93, 95, 96, 98, or 99 to optionally include that the low segregation conditions include a reduced substrate temperature, the temperature reduced by more than 200 degrees Celsius as compared to a temperature used for processing other active device layers.

Example 101 can include, or can optionally be combined with the subject matter of one or any combination of Examples 91, 93, 95, 96, or 98 through 100 to optionally include that the low segregation conditions include a reduced substrate temperature, the temperature reduced by more than 300 degrees Celsius as compared to a temperature used for processing other active device layers.

Example 102 can include, or can optionally be combined with the subject matter of one or any combination of Examples 92, 94 through 96, or 98 through 101 to optionally include that the high segregation conditions include normal to elevated substrate temperatures as compared to a temperature used for processing other active device layers.

Example 103 can include, or can optionally be combined with the subject matter of one or any combination of Examples 92, 94 through 96, or 98 through 102 to optionally include that the high segregation conditions include elevated substrate temperature.

Example 104 can include, or can optionally be combined with the subject matter of one or any combination of Examples 91, 93, 95, or 97 to optionally include that wherein the low segregation conditions included elevated reactor pressure for chemical vapor deposition.

Example 105 can include, or can optionally be combined with the subject matter of one or any combination of Examples 91, 93, 95, 97, or 104 to optionally include that the low segregation conditions include elevated reactor pressure up to atmospheric pressure for chemical vapor deposition.

Example 106 can include, or can optionally be combined with the subject matter of one or any combination of Examples 91, 93, 95, 97, 104 or 105 to optionally include that the low segregation conditions include elevated reactor pressure up to atmospheric pressure using a hydrogen-containing gas.

Example 107 can include, or can optionally be combined with the subject matter of one or any combination of Examples 92, 94, 97, or 104 through 106 to optionally include that the high segregation conditions include reduced reactor pressure as compared to a reactor pressure used for processing other active device layers.

Example 108 can include or use subject matter (such as an apparatus, a method, a means for performing acts, or a device readable medium including instructions that, when performed by the device, can cause the device to perform acts), such as can include or use serially connected interband tunnel diode (ITD) devices for purposes of establishing two sequential negative differential resistances "humps" in a current-voltage relationship under forward bias, the serially connected ITD devices comprising a bottom injector layer separated by an offset from a bottom contact, a lower middle injector layer, a bottom spacer located between the bottom injector and lower middle injector layers configured to establish a first tunnel barrier, an upper middle injector layer, an upper spacer located between the upper middle injector layer and the top injector layer separated by an offset from a top contact, a top spacer located between the top injector and upper middle injector layers configured to establish a second tunnel barrier, where the bottom injector, lower middle injector, upper middle injector, and top injector layers form the ends of one of a p-i1-n-i2-p-i3-n structure or an n-i1-p-i2-n-i3-p structure, where an i1 region of the p-i1-n-i2-p-i3-n structure or the n-i1-p-i2-n-i3-p structure includes at least one intrinsic semiconductor material located between the bottom and lower middle injectors, and where an i2 region in the p-i1-n-i2-p structure or the n-i1-p-i2-n-i3-p structure includes at least one intrinsic semiconductor material provided between the lower middle injector and upper middle injector, and at least one intrinsic semiconductor material provided between the upper middle injector and top injectors.

Example 109 can include, or can optionally be combined with the subject matter of one or any combination of Examples 108 to optionally include three, four, five, six, seven, or even more serially connected interband tunnel diodes to create three, four, five, six, seven, or even more sequential negative differential resistance devices, respectively.

Example 110 can include, or can optionally be combined with the subject matter of one or any combination of Examples 108 and 109 where the serially connected interband tunnel diodes are used as the load in a multi-state memory circuit.

Example 111 can include, or can optionally be combined with the subject matter of one or any combination of Examples 108, 109 and 110 where the multi-state memory circuit includes multiple serially connected interband tunnel diodes connected in parallel with an external capacitor.

Example 112 can include, or can optionally be combined with the subject matter of Example 108, 109, 110, and 111, to optionally include an ITD comprising a resonant interband tunnel diode comprising a heterojunction.

Example 113 can include, or can optionally be combined with the subject matter of Examples 108 through 112, to optionally include and ITD comprising a resonant interband tunnel diode comprising a Si/SiGe heterojunction.

Example 114 can include, or can optionally be combined with the subject matter of one or any combination of Examples 108 through 113 to optionally include a RITD including a delta-doping profile.

Example 115 can include, or can optionally be combined with the subject matter of one or any combination of Examples 108 through 114 to optionally include an interband tunneling diode comprising a silicon-based RITD including a p-type delta doping of acceptors, an n-type delta doping of donors, a tunneling barrier located between the p-type and n-type delta doping layers, where a portion of the tunneling barrier comprises an alloy layer including at least two of silicon, germanium, carbon, and tin.

Example 116 can include, or can optionally be combined with the subject matter of one or any combination of Examples 108 through 115 to optionally include an interband tunneling diode comprises a silicon-based RITD including a p-type delta doping of acceptors, an n-type delta doping of donors located on a first side of the p-type delta doping, a barrier comprising a first alloy layer including at least two of silicon, germanium, carbon, and tin located on a first side of the p-type delta doping at least in part separating the p-type delta doping from the n-type delta doping, and an interposed second alloy layer including at least two of silicon, germanium, carbon, and tin adjacent the barrier first alloy layer and the p-type delta doping, the interposed second alloy layer and the barrier first alloy layer defining a unitary layer substantially containing the p-type delta doping.

Example 117 can include, or can optionally be combined with the subject matter of Examples 108 through 116 to optionally include a first alloy layer including a first mole fractions of constituents, and a second alloy layer including a different second mole fractions of constituents.

Example 118 can include or use subject matter (such as an apparatus, a method, a means for performing acts, or a device readable medium including instructions that, when performed by the device, can cause the device to perform acts), such as can include or use serially connected interband tunnel diode devices for purposes of two sequential negative differential resistances "humps" under forward bias for use in any of the structures described herein, the method comprising forming a first conductivity type layer on a substrate, forming a first confinement layer next to the first conductivity type layer, forming a first low-doped tunneling spacer layer next to the first confinement layer on a side opposite the first conductivity type layer, forming a first low-doped tunneling layer next to the first low doped tunneling spacer layer on a side opposite the first confinement layer, forming a second low-doped tunneling spacer layer next to the first-low doped tunneling layer on a side opposite the first low-doped tunneling spacer layer, forming a second confinement layer next to the second low-doped tunneling spacer layer on a side opposite the first low-doped tunneling layer, forming a third low-doped tunneling spacer layer next to the second confinement layer on a side opposite the second low-doped tunneling spacer layer, forming a third low-doped tunneling layer next to the third low-doped tunneling spacer layer on a side opposite the second confinement layer, forming a third confinement layer next to a third low-doped tunneling layer, forming a third conductivity type layer next to the third confinement layer, forming a fourth low-doped tunneling spacer layer next to the third confinement layer on a side opposite the third low-doped tunneling spacer layer, forming a fourth low-doped tunneling layer next to the fourth low-doped tunneling spacer layer on a side opposite the third confinement layer.

Example 119 can include, or can optionally be combined with the subject matter of Example 118, to optionally include that the confinement layers are each fabricated by establishing an energy band offset at, or near, a heterojunction.

Example 120 can include, or can optionally be combined with the subject matter of one or any combination of Examples 118 or 119 to optionally include that the confinement layers are each fabricated by forming a highly doped layer.

Example 121 can include, or can optionally be combined with the subject matter of one or any combination of Examples 118 through 120 to optionally include that the confinement layers are each fabricated to include a delta-doped layer.

Example 122 can include, or can optionally be combined with the subject matter of one or any combination of Examples 108 through 121 to optionally include three, four, five, six, seven, or even more serially connected interband tunnel diodes to create three, four, five, six, seven, or even more sequential negative differential resistance devices, respectively.

Example 123 can include, or can optionally be combined with the subject matter of one or any combination of Examples 108 through 122 where the serially connected interband tunnel diodes are used as the load in multi-state memory circuit.

Various Notes

Each of the non-limiting examples described herein can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. In this document, use of the phrase metal-oxide-semiconductor in the context of CMOS or MOS devices or processing does not literally require that a metal gate is used for CMOS or MOS structures, but instead refers to the fact that a conductive gate material (e.g., polysilicon or another conductor) can be used. For example, conductors can include a metal, a silicide, or a semiconductor material (e.g., having doping to achieve a desired conductivity).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic device, comprising:
an integrated circuit including:
an integrated transistor;
an integrated capacitor coupled to the integrated transistor;
multiple stacked tunnel diode devices configured to provide multiple negative differential resistance regions;
a storage node;
wherein the integrated transistor, the integrated capacitor, the multiple stacked tunnel devices and the storage node are arranged to provide a multi-state memory cell;
wherein the integrated capacitor is disposed separate from the multiple tunnel diode devices and is coupled parallel to the stacked multiple tunnel diode devices;
wherein an output voltage at the storage node is determined based upon a voltage division between the stacked multiple tunnel diode devices coupled parallel to the integrated capacitor and an external load coupled to a power supply voltage and the storage node;
the integrated circuit further including,
a bit line;
a switch circuit configured to selectably couple the bit line to the storage node;
wherein the stacked multiple tunnel diode devices coupled parallel to the integrated capacitor are configured to provide a self-restoring current to hold a voltage stored on the integrated capacitor at a value written to the integrated capacitor on the bit line corresponding to multiple bits, without requiring a refresh;
wherein the stacked multiple tunnel diode devices include resonant interband tunneling diodes (RITD) including a Si/SiGe heterojunction and a delta-doping profile; and
the integrated capacitor providing a capacitance separate from a parasitic capacitance of the multiple stacked tunnel diode devices.

2. The electronic device of claim 1, wherein the external load includes at least one integrated circuit element including at least one of a resistor, a diode or a transistor.

* * * * *